(12) United States Patent
Maeno

(10) Patent No.: US 6,401,226 B1
(45) Date of Patent: Jun. 4, 2002

(54) ELECTRONIC SYSTEM WITH SELF-TEST FUNCTION AND SIMULATION CIRCUIT FOR ELECTRONIC SYSTEM

(75) Inventor: Hideshi Maeno, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/348,839

(22) Filed: Jul. 8, 1999

(30) Foreign Application Priority Data

Mar. 16, 1999 (JP) .............................................. 11-070937

(51) Int. Cl.$^7$ .............................................. G01R 31/28
(52) U.S. Cl. ....................................... 714/728; 714/739
(58) Field of Search ................................ 714/726–728, 714/732–733, 738

(56) References Cited

U.S. PATENT DOCUMENTS 5,831,992 A * 11/1998 Wu ............................. 714/732
5,872,793 A * 2/1999 Attaway et al. ............ 714/726

OTHER PUBLICATIONS

Charles L. Hudson, Jr. and Gary D. Peterson, "Parallel Self–Test With Pseudo–Random Test Patterns", IEEE 1987 International Test Conference, Paper 41.1., pp. 954–963.

* cited by examiner

*Primary Examiner*—Albert Decady
*Assistant Examiner*—Shelly A Chase
(74) *Attorney, Agent, or Firm*—Burns, Doane, Swecker & Mathis, LLP

(57) ABSTRACT

An electronic system with a self-test function has a pseudo-random test pattern generator that serially generates data constituting a pseudo-random test pattern, and stores a 1-bit shifted pseudo-random test pattern obtained by shifting the pseudo-random test pattern by one bit. When a scan-path circuit supplies the pseudo-random test pattern to a tested circuit which carries out an operation based on the pseudo-random test pattern, and then loads an operation result of the tested circuit, the 1-bit shifted pseudo-random test pattern is supplied to the tested circuit as the next pseudo-random test pattern. This makes it possible to solve a problem of a conventional electronic system in that it takes a long time to evaluate the operation results of the tested circuit because it takes at least (1+n)×m clock cycles, where m is the number of pseudo-random test patterns supplied to the tested circuit and n is the number of stages of the scan-path circuit.

5 Claims, 25 Drawing Sheets

FIG.5

| t | SIS | S3 | S2 | S1 | S0 |
|---|---|---|---|---|---|
| 0 | I(0) | R3 | R2 | R1 | R0 |
| 1 | I(1) | R0^I(0) | R3 | R2 | R1 |
| 2 | I(2) | R1^I(1) | R0^I(0) | R3 | R2 |
| 3 | I(3) | R2^I(2) | R1^I(1) | R0^I(0) | R3 |
| 4 | I(4) | R3^I(3) | R2^I(2) | R1^I(1) | R0^I(0) |
| 5 | I(5) | R0^I(0)^I(4) | R3^I(3) | R2^I(2) | R1^I(1) |
| 6 | I(6) | R1^I(1)^I(5) | R0^I(0)^I(4) | R3^I(3) | R2^I(2) |
| 7 | I(7) | R2^I(2)^I(6) | R1^I(1)^I(5) | R0^I(0)^I(4) | R3^I(3) |
| 8 | I(8) | R3^I(3)^I(7) | R2^I(2)^I(6) | R1^I(1)^I(5) | R0^I(0)^I(4) |
| 9 | I(9) | R0^I(0)^I(4)^I(8) | R3^I(3)^I(7) | R2^I(2)^I(6) | R1^I(1)^I(5) |
| 10 | I(10) | R1^I(1)^I(5)^I(9) | R0^I(0)^I(4)^I(8) | R3^I(3)^I(7) | R2^I(2)^I(6) |
| 11 | I(11) | R2^I(2)^I(6)^I(10) | R1^I(1)^I(5)^I(9) | R0^I(0)^I(4)^I(8) | R3^I(3)^I(7) |
| 12 | I(12) | R3^I(3)^I(7)^I(11) | R2^I(2)^I(6)^I(10) | R1^I(1)^I(5)^I(9) | R0^I(0)^I(4)^I(8) |
| ---- | ---------- | ---------- | ---------- | ---------- | ---------- |

| I7(0) | I6(0) | I5(0) | I4(0) | I3(0) | I2(0) | I1(0) | I0(0) |
|---|---|---|---|---|---|---|---|
| I7(1) | I6(1) | I5(1) | I4(1) | I3(1) | I2(1) | I1(1) | I0(1) |
| I7(2) | I6(2) | I5(2) | I4(2) | I3(2) | I2(2) | I1(2) | I0(2) |
| I7(3) | I6(3) | I5(3) | I4(3) | I3(3) | I2(3) | I1(3) | I0(3) |
| I7(4) | I6(4) | I5(4) | I4(4) | I3(4) | I2(4) | I1(4) | I0(4) |
| I7(5) | I6(5) | I5(5) | I4(5) | I3(5) | I2(5) | I1(5) | I0(5) |
| I7(6) | I6(6) | I5(6) | I4(6) | I3(6) | I2(6) | I1(6) | I0(6) |
| I7(7) | I6(7) | I5(7) | I4(7) | I3(7) | I2(7) | I1(7) | I0(7) |
| I7(8) | I6(8) | I5(8) | I4(8) | I3(8) | I2(8) | I1(8) | I0(8) |
| I7(9) | I6(9) | I5(9) | I4(9) | I3(9) | I2(9) | I1(9) | I0(9) |
| I7(10) | I6(10) | I5(10) | I4(10) | I3(10) | I2(10) | I1(10) | I0(10) |
| I7(11) | I6(11) | I5(11) | I4(11) | I3(11) | I2(11) | I1(11) | I0(11) |
| I7(12) | I6(12) | I5(12) | I4(12) | I3(12) | I2(12) | I1(12) | I0(12) |
| I7(13) | I6(13) | I5(13) | I4(13) | I3(13) | I2(13) | I1(13) | I0(13) |
| I7(14) | I6(14) | I5(14) | I4(14) | I3(14) | I2(14) | I1(14) | I0(14) |

FIG.27(PRIOR ART)

| STATE | G4 | G3 | G2 | G1 | G0(SOG) |
|---|---|---|---|---|---|
| 0 | 1 | 1 | 1 | 1 | 1 |
| 1 | 0 | 1 | 1 | 1 | 1 |
| 2 | 0 | 0 | 1 | 1 | 1 |
| 3 | 0 | 0 | 0 | 1 | 1 |
| 4 | 1 | 0 | 0 | 0 | 1 |
| 5 | 1 | 1 | 0 | 0 | 0 |
| 6 | 0 | 1 | 1 | 0 | 0 |
| 7 | 1 | 0 | 1 | 1 | 0 |
| 8 | 1 | 1 | 0 | 1 | 1 |
| 9 | 1 | 1 | 1 | 0 | 1 |
| 10 | 0 | 1 | 1 | 1 | 0 |
| 11 | 1 | 0 | 1 | 1 | 1 |
| 12 | 0 | 1 | 0 | 1 | 1 |
| 13 | 1 | 0 | 1 | 0 | 1 |
| 14 | 0 | 1 | 0 | 1 | 0 |
| 15 | 0 | 0 | 1 | 0 | 1 |
| 16 | 0 | 0 | 0 | 1 | 0 |
| 17 | 0 | 0 | 0 | 0 | 1 |
| 18 | 1 | 0 | 0 | 0 | 0 |
| 19 | 0 | 1 | 0 | 0 | 0 |
| 20 | 0 | 0 | 1 | 0 | 0 |
| 21 | 1 | 0 | 0 | 1 | 0 |
| 22 | 0 | 1 | 0 | 0 | 1 |
| 23 | 1 | 0 | 1 | 0 | 0 |
| 24 | 1 | 1 | 0 | 1 | 0 |
| 25 | 0 | 1 | 1 | 0 | 1 |
| 26 | 0 | 0 | 1 | 1 | 0 |
| 27 | 1 | 0 | 0 | 1 | 1 |
| 28 | 1 | 1 | 0 | 0 | 1 |
| 29 | 1 | 1 | 1 | 0 | 0 |
| 30 | 1 | 1 | 1 | 1 | 0 |

ELECTRONIC SYSTEM WITH SELF-TEST FUNCTION AND SIMULATION CIRCUIT FOR ELECTRONIC SYSTEM

BACKGROUND OF THE INVENTION

1. Field of the Invention

The present invention relates to an electronic system with a self-test function capable of evaluating operation results of a tested circuit, and a simulation system of the electronic system capable of simulating the operation of the electronic system.

2. Description of Related Art

FIG. 23 is a block diagram showing a configuration of a conventional electronic system with a self-test function. In FIG. 23, the reference numeral 1 designates a pseudo-random test pattern generator for serially outputting data constituting a pseudo-random test pattern; 2 designates a scan-path circuit that acquires a pseudo-random test pattern by loading the data serially output from the pseudo-random test pattern generator 1, and supplies a logic circuit to be tested (simply called "tested circuit" from now on) 3 with the pseudo-random test pattern in parallel, and that loads an operation result of the tested circuit 3 in parallel, and serially outputs data constituting the operation result; 3 designates the tested circuit that receives from the scan-path circuit 2 the pseudo-random test pattern in parallel, executes predetermined logical operations based on the pseudo-random test pattern, and supplies the scan-path circuit 2 with the operation result in parallel; 4 designates a signature register that loads the data serially output from the scan-path circuit 2, and compresses the operation result; and 5 designates a controller for controlling the pseudo-random test pattern generator 1, scan-path circuit 2 and signature register 4.

FIG. 24 is a block diagram showing a configuration of the pseudo-random test pattern generator 1. In FIG. 24, the symbol XOR designates an exclusive-OR circuit; and G0–G4 each designate a flip-flop with a hold function, which holds its data when HOLDG=1, and shifts the data when HOLDG=0. Here, the pseudo-random test pattern generator 1 of FIG. 24 is an LFSR (Linear Feedback Shift Register) type circuit.

FIG. 25 is a block diagram showing a configuration of the scan-path circuit 2. In FIG. 25, symbols SFF0–SFFn–1 each designate a scan flip-flop which carries out a serial shift operation when SM=1, and a parallel input operation from the D terminal when SM=0. Here, the scan flip-flops SFF0–SFFn–1 consists of a selector and a flip-flop.

FIG. 26 is a block diagram showing a configuration of the signature register 4. In FIG. 26, the symbol XORF and XOR3 each designate an exclusive-OR circuit; and S0–S3 each designate a flip-flop with a hold function, which holds its data when HOLDS=1, and shifts the data when HOLDS=0. Here, the signature register 4 of FIG. 26 is an FSR (Feedback Shift Register) type circuit.

Next, the operation of the conventional electronic system with a self-test function will be described.

The electronic system with a self-test function executes the evaluation of the operation of the tested circuit 3 through the following roughly divided four processings.

(1) Set initial patterns to the pseudo-random test pattern generator 1, scan-path circuit 2 and signature register 4.

To prevent undefined operation of the electronic system, a processing is carried out first for setting initial values to the flip-flops G0–G4 in the pseudo-random test pattern generator 1, to the scan flip-flops SFF0–SFFn–1 in the scan-path circuit 2, and to the flip-flops S0–S3 in the signature register 4. The setting of the initial values are carried out by the controller 5 or by an initializing circuit not shown.

(2) Supply the pseudo-random test pattern from the scan-path circuit 2 to the tested circuit 3 in parallel, and feed the operation result back from the tested circuit 3 to the scan-path circuit 2 in parallel (the initial pattern, which is supplied as the pseudo-random test pattern at the first time, may be other than a pseudo-random test pattern).

Holding the pseudo-random test pattern, the scan-path circuit 2 supplies the tested circuit 3 with values held by the scan flip-flops SFF0–SFFn–1 from their Q terminals.

Thus, the tested circuit 3 receives from the scan-path circuit 2 the pseudo-random test pattern in parallel, executes the logical operation in accordance with the pseudo-random test pattern, and supplies the operation result to the scan-path circuit 2 in parallel.

Since the controller 5 places SM at "0" in this case, the scan-path circuit 2 captures in parallel through the D terminals the operation result output from the tested circuit 3, and stores the data constituting the operation result into the scan flip-flops SFF0–SFFn–1.

At this stage, since the controller 5 places the HOLDG and HOLDS at "1", the pseudo-random test pattern generator 1 and scan-path circuit 2 hold the data rather than shift the data.

(3) Execute n-time shift operation of the pseudo-random test pattern generator 1, scan-path circuit 2 and signature register 4 (where n is the number of stages of the scan-path circuit 2).

The pseudo-random test pattern generator 1 serially supplies from the SOG terminal to the scan-path circuit 2 the data constituting the pseudo-random test pattern. More specifically, when the controller 5 places the terminal HOLDG at "0" after the initial set of the flip-flops G0–G4 in the pseudo-random test pattern generator 1, the pseudo-random test pattern generator 1 starts receiving a clock signal, and shifts its data in synchronism with the clock signal. For example, when the initial values "11111" are set to the flip-flops G0–G4, (see, STATE 0 of FIG. 27), the values stored in the flip-flops G0–G4 vary as shown in FIG. 27 every time the clock pulse is supplied, and the value stored in the flip-flop G0 is serially supplied to the scan-path circuit 2.

Since the controller 5 sets SM of the scan-path circuit 2 at "1" in this state, the scan-path circuit 2 serially loads through the SI terminal the data constituting the pseudo-random test pattern serially output from the pseudo-random test pattern generator 1 (the value stored in the flip-flop G0) in response to the clock signal, and stores the data into the scan flip-flop SFFn–1. At the same time, the scan flip-flops SFF0–SFFn–1 each shift their data to their right neighboring scan flip-flops. Thus, the data held by the scan flip-slop SFF0 is serially supplied to the signature register 4 every time the clock pulse is supplied.

The shift operation, which is carried out by the number of stages of the scan-path circuit 2, is completed when the data previously loaded into the scan flip-flop SFFn–1 by the parallel input of the operation result from the tested circuit 3 (the foregoing processing (2)) is transferred to the signature register 4.

At the same time that the shift operation is completed, the tested circuit 3 completes the output of the operation result, and the scan flip-flops SFF0–SFFn–1 complete the storing of the data constituting the pseudo-random test pattern.

Because the controller 5 sets the signal HOLDS at "0" in this state, the signature register 4, receiving the clock signal, serially loads through the SIS terminal the data constituting the operation result of the tested circuit 3, which is output from the scan flip-flop SFF0 of the scan-path-circuit 2. Receiving the data constituting the operation result, the signature register 4 compresses the data by carrying out the shift operation in synchronism with the clock signal, thereby compressing the n-bit operation result into 4-bit data. Thus, the values stored in the flip-flops S0–S3 become the operation result when the shift operation has been iterated n times.

(4) Repeat the foregoing processings (2) and (3) (m−1) times.

The scan-path circuit 2 sequentially supplies the tested circuit 3 with (m−1) pseudo-random test patterns following the initial pattern in parallel, and acquires the operation result of the tested circuit 3 in parallel (m−1) times, thereby successively stores the compression results of the total of m operation results (including the logical operation result based on the initial pattern) in the flip-flops S0–S3 of the signature register 4. The go/no-go decision of the electronic system is made by an external test instrument that compares the values stored in the flip-flops S0–S3 of the signature register 4 with expected values.

With the foregoing configuration, the conventional electronic system with a self-test function has a problem of taking a long time to evaluate the operation results because the processings (2)–(4) require (1+n)×m clock cycles to evaluate the operation results of the m-time logical operations by the tested circuit 3 (which will be referred to as "logical simulation" from now on).

Furthermore, to execute a fault simulation to obtain a fault detection rate, the logical simulation must be iterated multiple times (for example, k times), which means that the total of (1+n)×m×k clock cycles is required.

Accordingly, in the state of the art, the logical simulation entails a considerable cost (such as computer cost).

SUMMARY OF THE INVENTION

The present invention is implemented to solve the foregoing problem. It is therefore an object of the present invention to provide an electronic system with a self-test function capable of evaluating the logical operation of a tested circuit by using a simulation system, which can execute the logical simulation in a less clock cycles, rather than by activating an actual circuit.

Another object of the present invention is to provide a simulation system of the electronic system, which can evaluate the logical operation of a tested circuit mounted on the electronic system in a short time.

According to a first aspect of the present invention, there is provided an electronic system with a self-test function comprising: a pseudo-random test pattern generator for serially outputting data constituting a pseudo-random test pattern; a scan-path circuit for capturing the pseudo-random test pattern by receiving the data serially output from the pseudo-random test pattern generator, for supplying the pseudo-random test pattern in parallel to a tested circuit, for receiving in parallel an operation result of the tested circuit, and for serially outputting data constituting the operation result; a data compression circuit for compressing the operation result by receiving the data serially output from the scan-path circuit; and a memory for storing, when the pseudo-random test pattern generator begins to serially output the data constituting the pseudo-random test pattern, a 1-bit shifted pseudo-random test pattern that is obtained by shifting the pseudo-random test pattern by one bit, wherein the pseudo-random test pattern generator serially supplies the scan-path circuit with data constituting the 1-bit shifted pseudo-random test pattern when the scan-path circuit loads the operation result of the tested circuit in parallel.

Here, the electronic system with a self-test function may further comprise a comparator for comparing the operation result compressed by the data compression circuit with expected values.

The data compression circuit may comprise an exclusive OR circuit and a serial shift register, wherein the exclusive OR circuit receives data output from a final stage of the serial shift register and data serially output from the scan-path circuit, and supplies an initial stage of the serial shift register with data output from the exclusive OR circuit.

The scan-path circuit may comprise a greater number of flip-flops than a number of output terminals of the tested circuit, from which the operation result is output in parallel, and each of the flip-flops not connected to the output terminals of the tested circuit may load a fixed value when the scan-path circuit loads the operation result of the tested circuit in parallel.

The electronic system with a self-test function may further comprise, between the scan-path circuit and the data compression circuit, a gate circuit for placing the serial output of the scan-path circuit at a fixed value when the scan-path circuit comprises a greater number of flip-flops than a number of output terminals of the tested circuit, from which the operation result is output in parallel.

According to a second aspect of the present invention, there is provided a simulation system of an electronic system comprising: a virtual scan-path circuit including a serial shift register with a number of stages identical to a number of stages of a scan-path circuit of the electronic system, the virtual scan-path circuit shifting, every time the serial shift register supplies a pseudo-random test pattern in parallel to a tested circuit, the pseudo-random test pattern by one bit; a logic circuit including an identical number of exclusive OR circuits to a number of stages of a data compression circuit of the electronic system, the exclusive OR circuits carrying out logical operations between data constituting an operation result output from the tested circuit when the virtual scan-path circuit supplies the pseudo-random test pattern in parallel to the tested circuit; and a virtual data compression circuit for compressing the operation result of the tested circuit by receiving in parallel logical operation results by the logic circuit.

Here, the virtual data compression circuit may comprise, when the number of stages of the scan-path circuit equals N×M±1, where N is an integer and M is the number of stages of the compression circuit, M exclusive OR circuits and M flip-flops alternately connected in series, and the exclusive OR circuits in the virtual data compression circuit may receive data output from the exclusive OR circuits constituting the logic circuit and data output from previous and final stage flip-flops in the virtual compression circuit, and supply logical operation results of the exclusive OR circuits in the virtual data compression circuit to subsequent flip-flops in the virtual data compression circuit.

The virtual data compression circuit may comprise, when the number of stages of the scan-path circuit equals N×M, where N is an integer and M is the number of stages of the compression circuit, M exclusive OR circuits, and the exclusive OR circuits in the virtual data compression circuit may receive data output from the exclusive OR circuits constituting the logic circuit and data output from post-stage flip-flops in the virtual data compression circuit, and supply logical operation results of the exclusive OR circuits in the virtual data compression circuit to subsequent lip-flops in the virtual data compression circuit.

BRIEF DESCRIPTION OF THE DRAWINGS

FIG. 5 is a table showing values stored in flip-flops of the signature register;

FIG. 7 is a diagram illustrating relationships between individual data;

FIG. 16 is a diagram illustrating relationships between individual data;

FIG. 27 is a diagram illustrating pseudo-random test patterns.

DETAILED DESCRIPTION OF THE PREFERRED EMBODIMENTS

The invention will now be described with reference to the accompanying drawings.

EMBODIMENT 1

Figure 1:
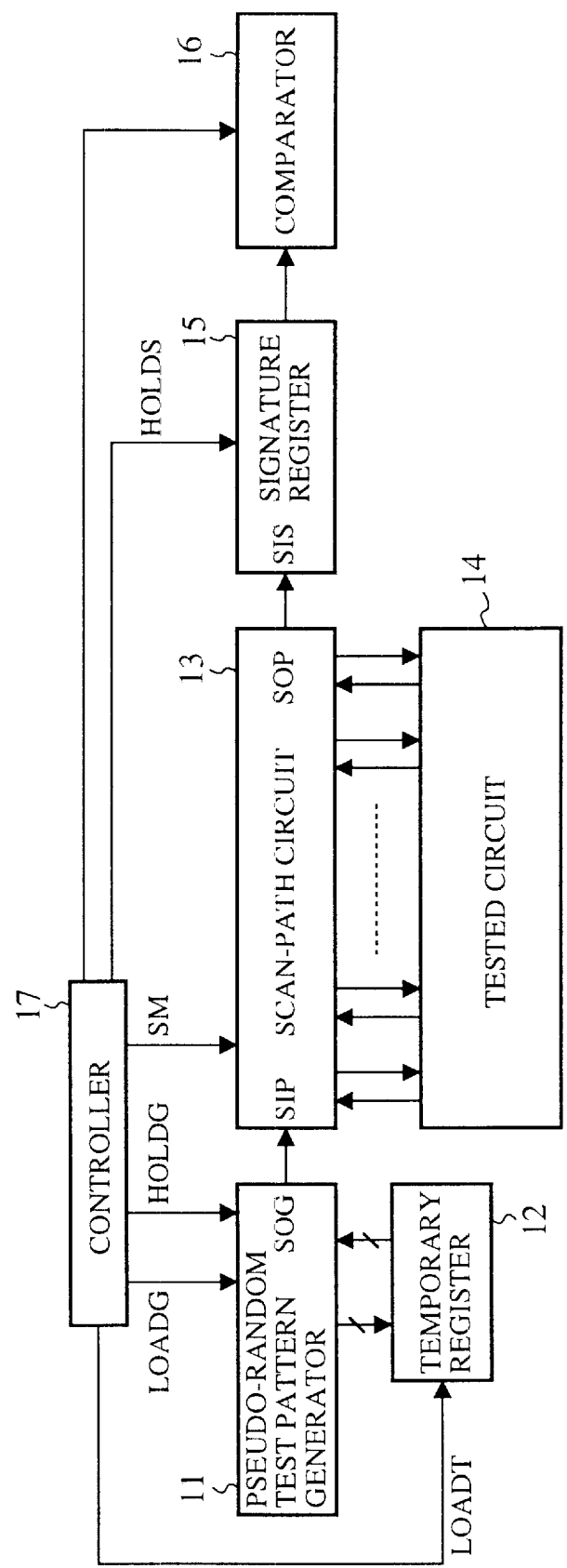
FIG. 1 is a block diagram showing an embodiment 1 of an electronic system with a self-test function in accordance with the present invention.
Figure 25:
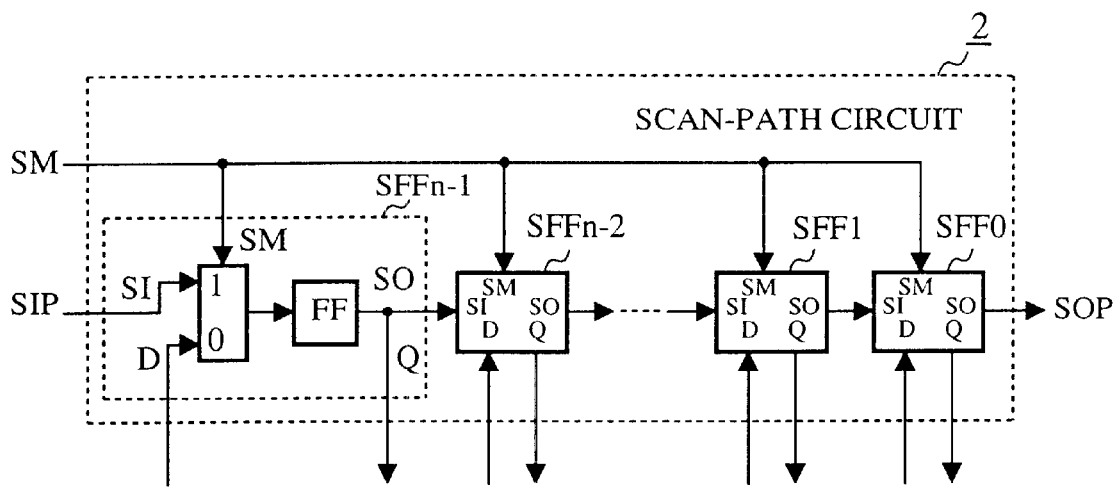
FIG. 25 is a block diagram showing the scan-path circuit of FIG. 23.

FIG. 1 is a block diagram showing an embodiment 1 of an electronic system with a self-test function in accordance with the present invention. In FIG. 1, the reference numeral 11 designates a pseudo-random test pattern generator for serially generating data constituting a pseudo-random test pattern; 12 designates a temporary register for storing, when the pseudo-random test pattern generator 11 starts the serial output of the data constituting the pseudo-random test pattern, a pseudo-random test pattern which is shifted by one bit; 13 designates a scan-path circuit that acquires a pseudo-random test pattern by serially loading the data serially output from the pseudo-random test pattern generator 11, and supplies a tested circuit 14 with the pseudo-random test pattern in parallel, and that receives an operation result of the tested circuit 14 in parallel, and serially outputs data constituting the operation result. The scan-path circuit 13 is a circuit similar to the conventional scan-path circuit 2 as shown in FIG. 25.

The reference numeral 14 designates the tested circuit that receives from the scan-path circuit 13 the pseudo-random test pattern in parallel, executes predetermined logical operations in accordance with the pseudo-random test pattern, and supplies the scan-path circuit 13 with the operation result in parallel; 15 designates a signature register that serially loads the data serially output from the scan-path circuit 13, and compresses the operation result; 16 designates a comparator for comparing the operation result compressed by the signature register 15 with an expected value to make a go/no-go decision of the operation result; and 17 designates a controller for controlling the pseudo-random test pattern generator 11, temporary register 12, scan-path circuit 13, signature register 15 and comparator 16.

Figure 2:
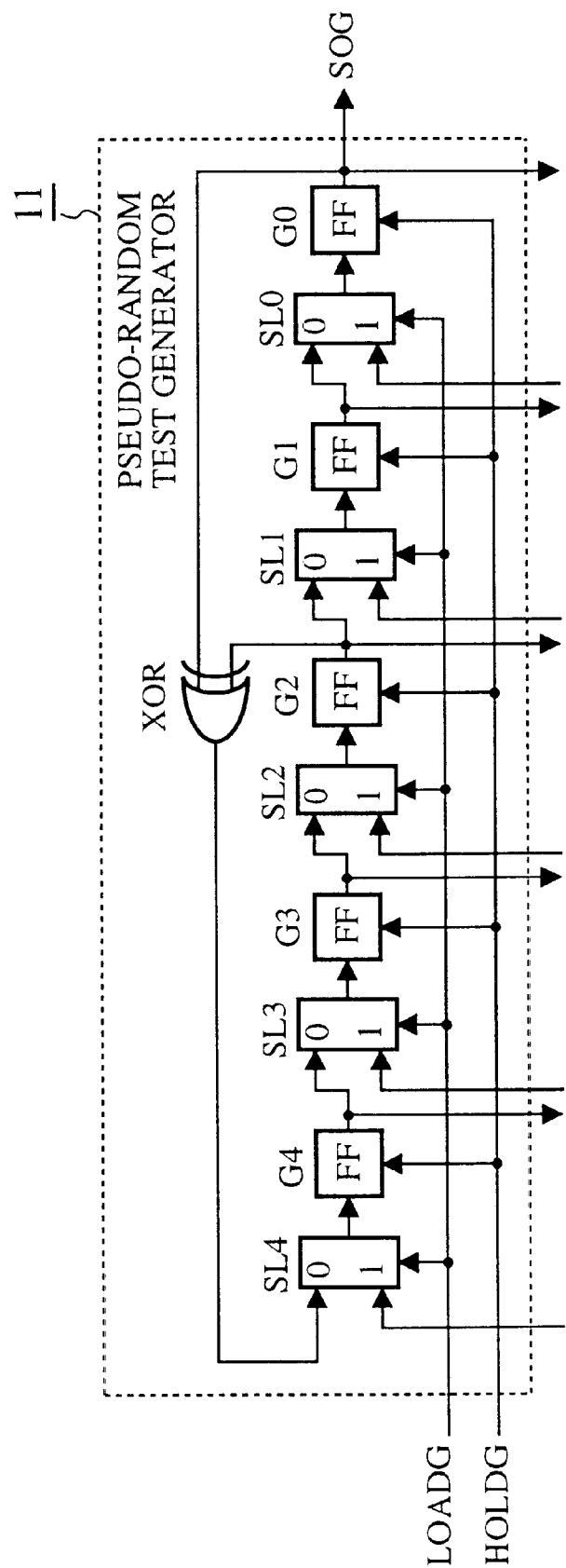
FIG. 2 is a block diagram showing a pseudo-random test pattern generator.

FIG. 2 is a block diagram showing a configuration of the pseudo-random test pattern generator 11. In FIG. 2, the symbol XOR designates an exclusive-OR circuit; SL0–SL4 each designate a selector for switching the input of the data; and G0–G4 each designate a flip-flop with a hold function, which holds its data when HOLDG=1, and shifts the data when HOLDG=0. Here, the pseudo-random test pattern generator 11 of FIG. 2 is an LFSR (Linear Feedback Shift Register) type circuit.

Figure 3:
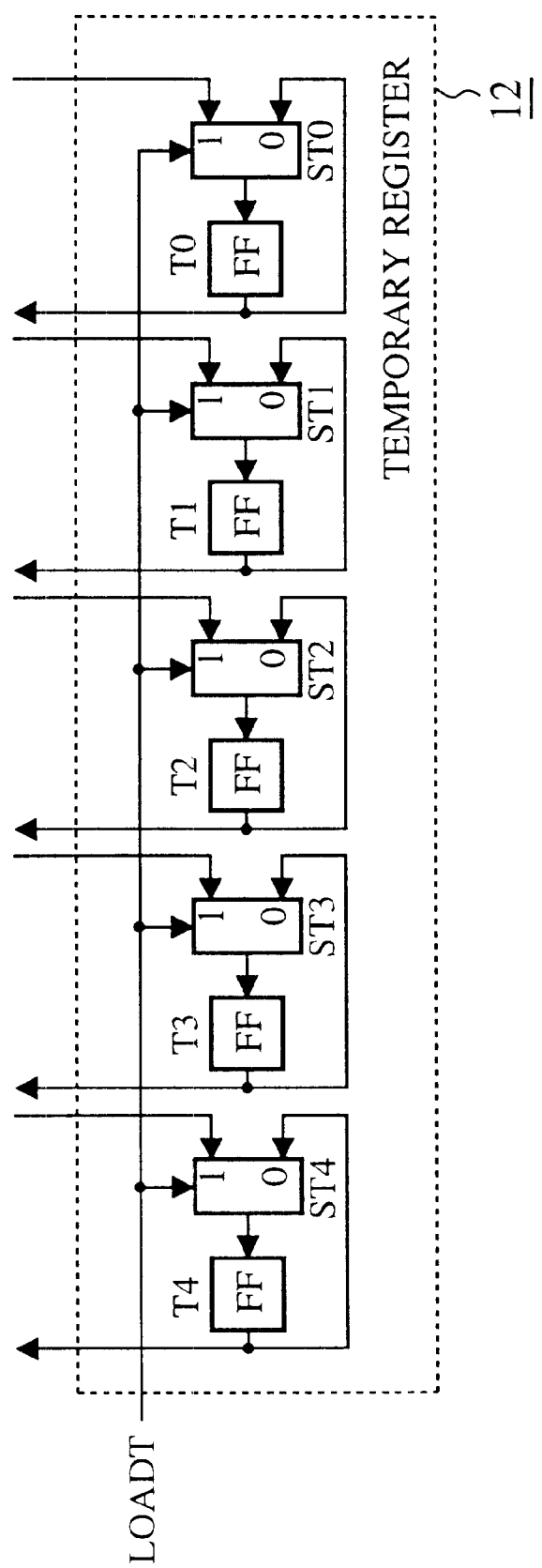
FIG. 3 is a block diagram showing a temporary register.

FIG. 3 is a block diagram showing a configuration of the temporary register 12. In FIG. 3, the symbols ST0–ST4 each designate a selector for switching the input of the data; and T0–T4 each designate a flip-flop with a hold function, which holds its data when HOLDG=1, and shifts the data when HOLDG=0.

Figure 4:
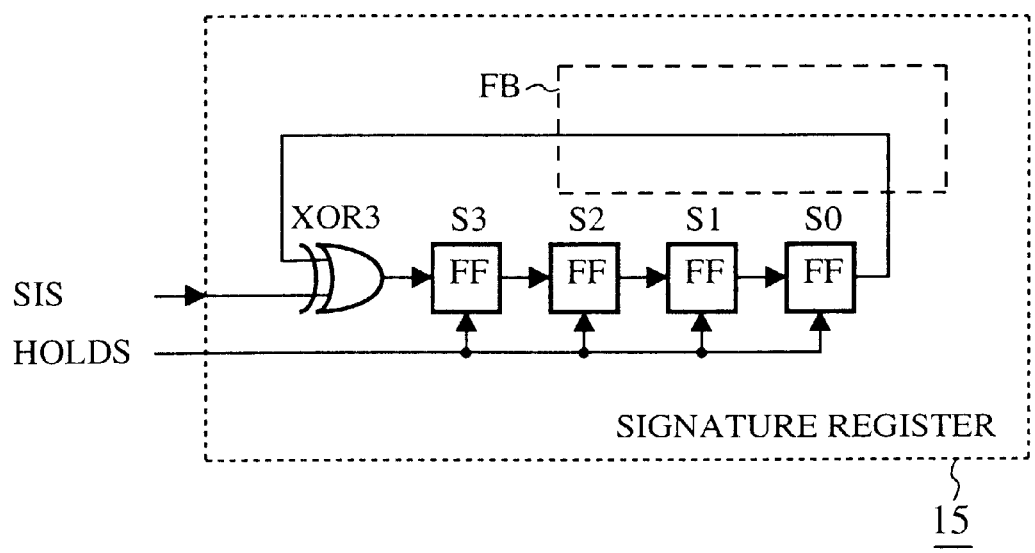
FIG. 4 is a block diagram showing a signature register.

FIG. 4 is a block diagram showing a configuration of the signature register 15. In FIG. 4, the symbol XOR3 designates an exclusive-OR circuit; and S0–S3 each designate a flip-flop with a hold function, which holds its data when HOLDS=1, and shifts the data when HOLDS=0. Here, the signature register 15 of FIG. 4 is an FSR (Feedback Shift Register) type circuit.

Next, the operation of the present embodiment 1 will be described.

The electronic system with a self-test function executes the evaluation of the operation of the tested circuit 14 through the following roughly divided nine processings.
(1) Set initial patterns to the pseudo-random test pattern generator 11 and signature register 15.

To prevent undefined operation of the electronic system, a first processing is carried out for setting initial values to the flip-flops G0–G4 in the pseudo-random test pattern generator 11, and to the flip-flops S0–S3 in the signature register 15. For example, they are set such as {G0, G1, G2, G3, G4}={1, 0, 1, 0, 1}, and {S0, S1, S2, S3}={0, 0, 0, 0}. The setting of the initial values are carried out by the controller 17 or by an initializing circuit not shown.
(2) Shift the pseudo-random test pattern in the pseudo-random test pattern generator 11 by one step.

When the initial values are set to the flip-flops G0–G4 of the pseudo-random test pattern generator 11, the controller 17 places the signals HOLDG and LOADG at "0" so that the pseudo-random test pattern generator 11 shifts the initial values by one step, thereby changing the values stored in the flip-flops G0–G4 such as {G0, G1, G2, G3, G4}={0, 1, 0, 1, 0}. Thus, the value "0" stored in the flip-flop G0 is serially supplied to the scan-path circuit 13 through the SOG terminal as the data constituting the pseudo-random test pattern.

Since the controller 17 places SM at "1" in this case, the scan-path circuit 13 captures through the SIP terminal the data serially output from the pseudo-random test pattern generator 11, and stores the data into the scan flip-flop SFFn−1, with shifting the values stored in the scan flip-flops SFF0–SFFn−1.

At this stage, since the controller 17 places the signals LOADT and HOLDS at "0" and "1", respectively, the temporary register 12 holds the data stored in the flip-flops T0–T4, and the signature register 15 holds the data stored in the flop-flops S0–S3.
(3) Supply in parallel the temporary register 12 with the pseudo-random test pattern that is shifted by one bit by the shift operation of the pseudo-random test pattern generator 11, and at the same time shift the pseudo-random test pattern in the pseudo-random test pattern generator 11 by one more step.

At this stage, the controller 12 sets the signals LOADT, HOLDG and LOADG at "1", "0" and "0", respectively. Thus, the pseudo-random test pattern generator 11 supplies the temporary register 12 with the values {0, 1, 0, 1, 0} in parallel which are stored in the flip-flops G0–G4 of the pseudo-random test pattern generator 11 at the time when the processing (2) has been completed, thereby storing the values in the flip-flops T0–T4. At the same time, the pseudo-random test pattern generator 11 shifts the values by one more step as in the processing (2).

In this case, since the controller 17 places SM at "1", the scan-path circuit 13 serially captures through the SIP terminal the data constituting the pseudo-random test pattern, that is, the value stored in the flip-flop G0 of the pseudo-random test pattern generator 11 as in the processing (2), and stores the data into the scan flip-flop SFFn−1, with shifting the values stored in the scan flip-flops SFF0–SFFn−1.

At the same time, since the controller 17 places the signal HOLDS at "1", the signature register 15 holds the data stored in the flop-flops S0–S3.
(4) Shift the contents of the pseudo-random test pattern generator 11 and scan-path circuit 13 by (n−2) steps, where n is the number of stages of the scan-path circuit 13.

The controller 17 sets the signals HOLDG, LOADG and SM at "0", "0" and "1", respectively. Thus, the pseudo-random test pattern generator 11 shifts its content by (n−2) steps in synchronism with the clock signal, and the scan-path circuit 13, receiving the serial output of the pseudo-random test pattern generator 11 through the SIP terminal, shifts the values stored in the scan flip-flops SFF0–SFFn−1 in synchronism with the clock signal. This completes the setting of the pseudo-random test pattern (initial pattern at first) to the scan flip-flops SFF0–SFFn−1 of the scan-path circuit 13.

Then, the controller 17 sets the signals LOADT and HOLDS at "0" and "1", respectively. Thus, the temporary register 12 holds the data stored in the flip-flops T0–T4, and the signature register 15 holds the data stored in the flop-flops S0–S3, as in the processing (2).
(5) Supply pseudo-random test pattern (initial pattern at first) from the scan-path circuit 13 to the tested circuit 14 in parallel, and supply the operation result back from the tested circuit 14 to the scan-path circuit 13 in parallel.

The scan-path circuit 13 supplies the tested circuit 14 with the values stored in the scan flip-flops SFF0–SFFn−1 through the Q terminals. Receiving the pseudo-random test pattern in parallel from the scan-path circuit 13, the tested circuit 14 executes the logical operation based on the pseudo-random test pattern, and supplies the scan-path circuit 13 with the operation result in parallel.

Since the controller 17 places the signal SM at "0" at this stage, the scan-path circuit 13 loads the operation result of the tested circuit 14 in parallel through the D terminals so that the data constituting the operation result is stored in the scan flip-flops SFF0–SFFn−1.

In addition, the controller 17 sets the signal LOADG at "1" to load the next pseudo-random test pattern in the pseudo-random test pattern generator 11. Thus, the pseudo-random test pattern generator 11 loads its flip-flops G0–G4 with the values in parallel which are stored in the flip-flops T0–T4 in the temporary register 12 (the pseudo-random test pattern obtained by shifting the previous pseudo-random test pattern by one bit).

Furthermore, the controller sets the signal HOLDS at "1". Hence, the signature register 15 holds its data rather than shifts it.
(6) Shifts the contents of the pseudo-random test pattern generator 11, scan-path circuit 13 and signature register 15 by one step.

The pseudo-random test pattern generator 11 serially supplies the data constituting the pseudo-random test pattern to the scan-path circuit 13 through the SOG terminal. More specifically, the controller 17 sets the signal HOLDG at "0" after the next pseudo-random test pattern is placed in the flip-flops G0–G4 of the pseudo-random test pattern generator 11. This enables the clock signal to be supplied to the pseudo-random test pattern generator 11 which shifts its content by one step in response to the clock signal.

In addition, the controller 17 sets the signal SM at "1". Thus, receiving through the SIP terminal the data serially output from the pseudo-random test pattern generator 11, the scan-path circuit 13 stores the data in the scan flip-flop SFFn−1 with shifting the values stored in the scan flip-flops SFF0–SFFn−1.

Furthermore, the controller 17 sets the signal HOLDS at "0". Thus, the signature register 15 loads the XOR3 with the data (the value stored in the scan flip-flop SFF0) serially output from the scan-path circuit 13, and stores the logical operation result of the XOR3 into the flip-flop S3 with shifting the values stored in the flip-flops S0–S3.
(7) Supply the pseudo-random test pattern shifted by one bit to the temporary register 12 in parallel, and further shift the contents of the pseudo-random test pattern generator 11, scan-path circuit 13 and signature register 15.

The controller 17 sets the signals LOADT, HOLDG and LOADG to "1", "0" and "0", respectively. Thus, the temporary register 12 loads the flip-flops T0–T4 in parallel with the values stored in the flip-flops G0–G4 of the pseudo-random test pattern generator 11 at the time when the processing (6) has been completed, and the pseudo-random test pattern generator 11 shifts its content by one step as in the processing (6).

In addition, the controller 17 sets the signal SM at "1". Thus, receiving through the SIP terminal the data serially output from the pseudo-random test pattern generator 11, the scan-path circuit 13 stores the data in the scan flip-flop SFFn−1 with shifting the values stored in the scan flip-flops SFF0–SFFn−1 as in the processing (6).

Furthermore, the controller 17 sets the signal HOLDS at "0". Thus, the signature register 15 loads the XOR3 with the data (the value stored in the scan flip-flop SFF0) serially output from the scan-path circuit 13, and stores the logical operation result of the XOR3 into the flip-flop S3 with shifting the values stored in the flip-flops S0–S3 as in the processing (6).

(8) Shift the contents of the pseudo-random test pattern generator 11, scan-path circuit 13 and signature register 15 by (n−2) steps, where n is the number of stages of the scan-path circuit 13.

The controller 17 sets the signals HOLDG, LOADG and SM at "0", "0" and "1", respectively. Thus, in synchronism with the clock signal, the pseudo-random test pattern generator 11 shifts its content by (n−2) steps and the scan-path circuit 13 shifts the values stored in the scan flip-flops SFF0–SFFn−1 with receiving through the SIP terminal the data serially output from the pseudo-random test pattern generator 11.

When the shift operation completes, the scan-path circuit 13 completes the serial output of the operation result of the tested circuit 14, and the scan flip-flops SFF0–SFFn−1 complete storing the data constituting the next pseudo-random test pattern.

In addition, the controller 17 sets the signal HOLDS at "0", so that the signature register 15, receiving the clock signal, serially loads through the SIS terminal the data (the value stored in the scan flip-flop SFF0) which is output from the scan-path circuit 13 and constitutes the operation result of the tested circuit 14.

Receiving the data constituting the operation result, the signature register 15 executes the data compression with shifting its content in synchronism with the clock signal, so that the n-bit operation result is compressed into 4-bit data. In other words, the values stored in the flip-flops S0–S3 at the time when the n-step shift operation has been completed become the operation result. In this case, since the controller 17 sets the signal LOADT at "0", the temporary register 12 holds the values stored in the flip-flops T0–T4.

(9) Iterate the processings (5)–(8) (m−1) times.

The total of m compression results of the operation results are sequentially stored in the flip-flops S0–S3 of the signature register 15 by supplying the tested circuit 14 with (m−1) pseudo-random test patterns and by acquiring from the tested circuit 14 the operation results (m−1) times.

FIG. 5 illustrates the values stored in the flip-flops S0–S3 of the signature register 15. For example, after shifting 12 times, the flip-flop S0 stores the exclusive OR between R0, I(0), I(4) and I(8), where R0 denotes the initial value, and I(t) denotes the serial data supplied from the scan-path circuit 13 when shifting t times.

The go/no-go decision of the electronic system is made by comparing the values stored in the flip-flops S0–S3 of the signature register 15 with expected values. If the comparator 16 is not attached, an external test instrument executes the comparison instead.

Figure 6:
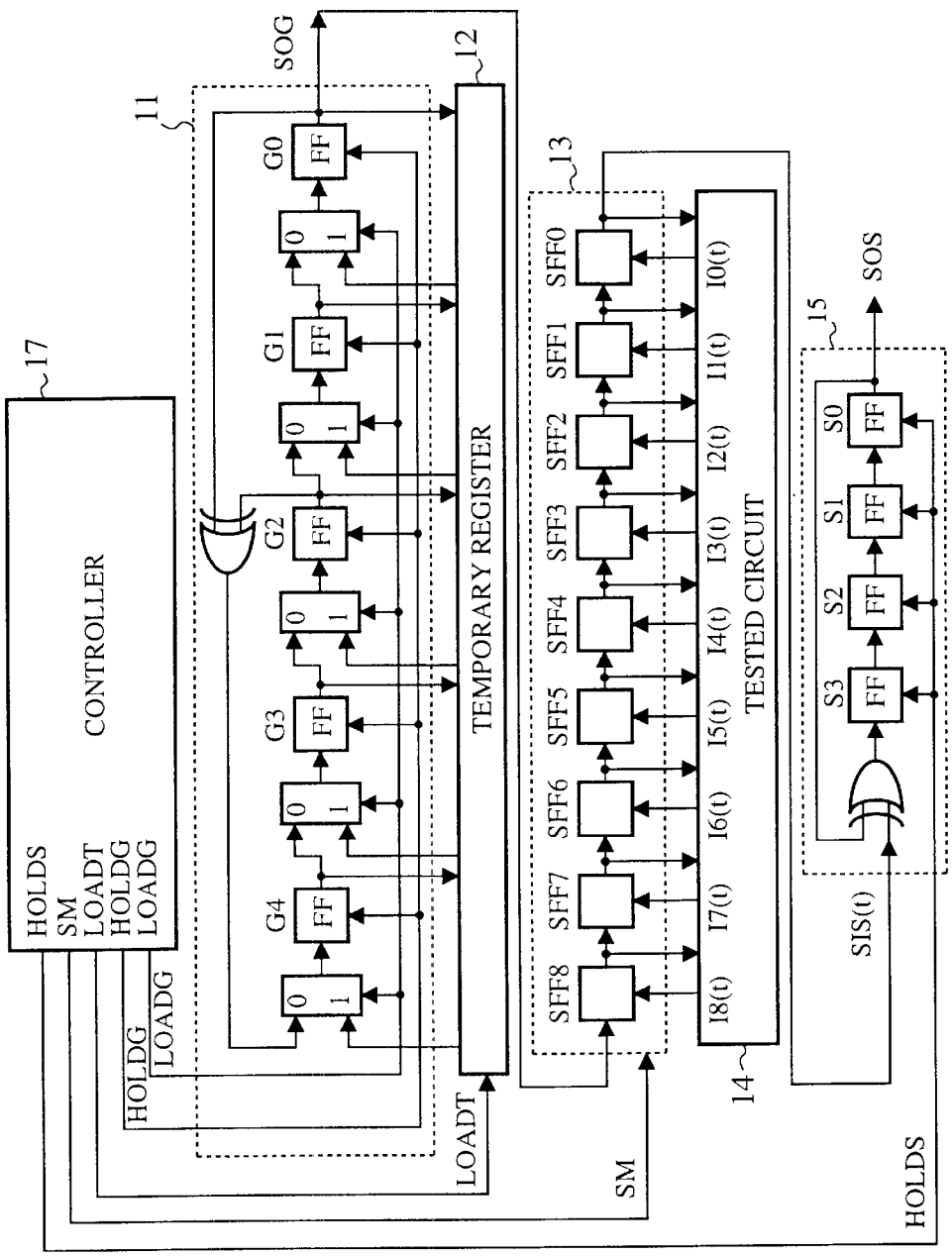
FIG. 6 is a block diagram showing a concrete example of the electronic system of FIG. 1.

FIG. 6 is a concrete example of the electronic system as shown in FIG. 1. In FIG. 6, the number of stages of the pseudo-random test pattern generator 11 is five, that of the scan-path circuit 13 is nine and that of the signature register 15 is four.

Figure 7:
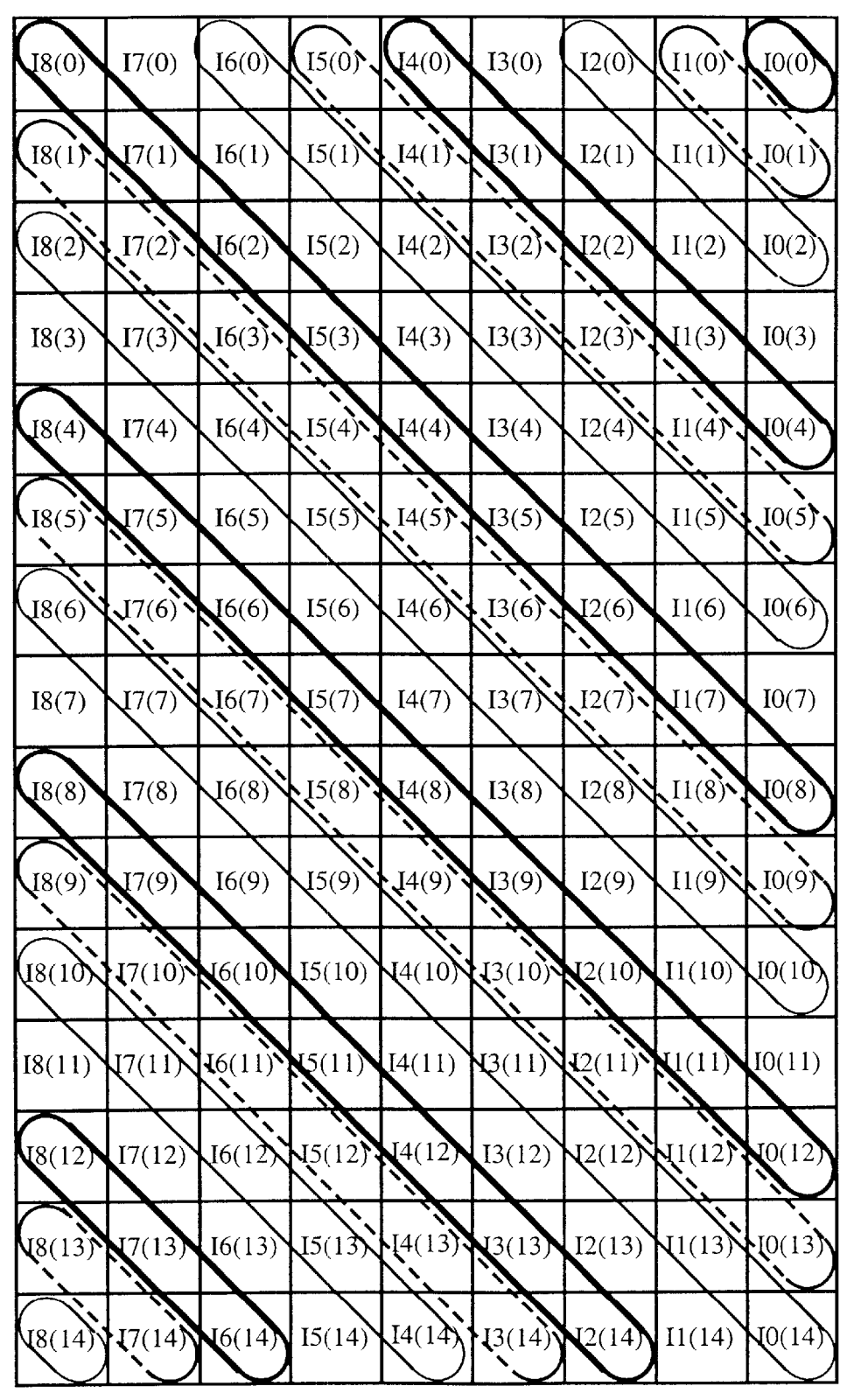

In FIG. 6, the 9-bit operation result is compressed to 4-bit data. For example, the flip-flop S3 of the signature register 15 stores the result of the XORs between the data (I0(0), I4(0), . . . ) enclosed by thick lines in FIG. 7; the flip-flop S2 stores the result of the XORs between the data (I1(0), I0(1), . . . ) enclosed by broken lines in FIG. 7; the flip-flop S1 stores the result of the XORs between the data (I2(0), I1(1), . . . ) enclosed by thin lines in FIG. 7; and the flip-flop S0 stores the result of the XORs between the unenclosed data (I3(0), I2(1), . . . ) in FIG. 7.

The relationships between the contents of the flip-flops S0–S3 and the set of four data (logical result) vary depending on the number of times m of the iteration.

Figure 23:
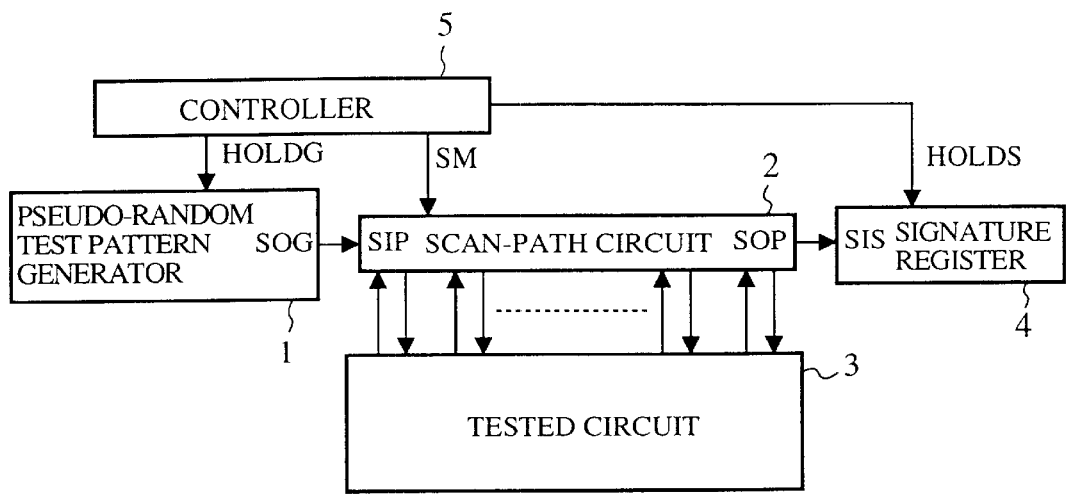
FIG. 23 is a block diagram showing a conventional electronic system with a self-test function.
Figure 24:
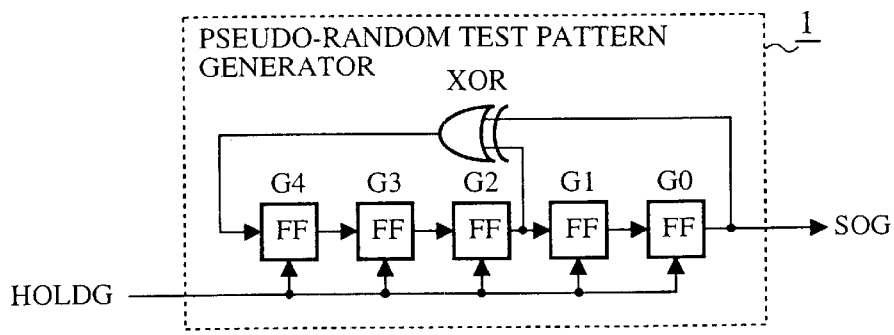
FIG. 24 is a block diagram showing the pseudo-random test pattern generator of FIG. 23.
Figure 26:
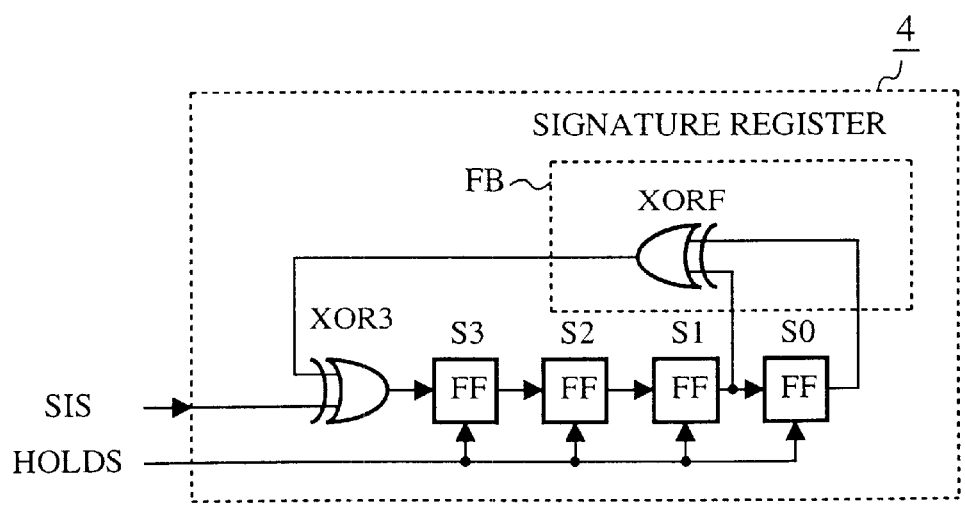
FIG. 26 is a block diagram showing the signature register of FIG. 23.

To achieve the steps of the processings (5)–(8) by the electronic circuit as shown in FIG. 6, the total of (1+n)×m clock cycles is required as in the conventional electronic circuit as shown in FIG. 23. This means that the logical simulation for evaluating the logical operation of the tested circuit 14, which is carried out by activating the actual circuit as shown FIG. 6, requires a long time no less than that of the conventional electronic circuit to complete the The electronic circuit in the present embodiment 1, however, comprises the temporary register 12 for storing the pseudo-random test pattern which is shifted by one bit as compared with the currently output pseudo-random test pattern, and excludes an XOR circuit like the XORF of FIG. 26 from the feedback loop of the signature register 15 as shown in FIG. 4. This makes it possible to evaluate the logical operation of the tested circuit 14 by activating, instead of the actual circuit as shown in FIG. 6, a simulation system which will be described below with reference to FIG. 8. As a result, the present embodiment 1 has an advantage of being able to execute the logical simulation in a much less clock cycles.

Figure 8:
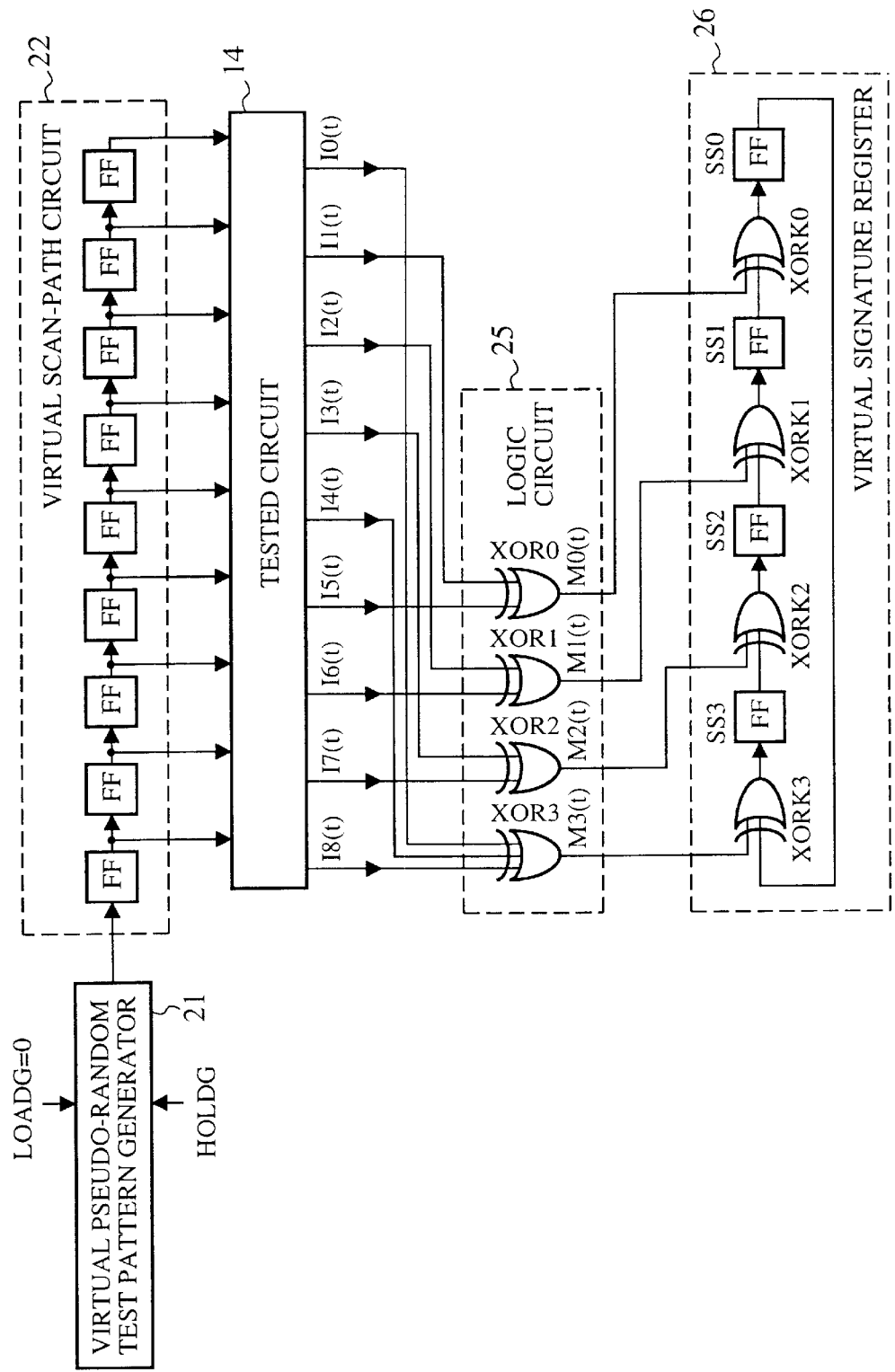
FIG. 8 is a block diagram showing a simulation system of the embodiment 1 of the electronic system in accordance with the present invention.

FIG. 8 is a block diagram showing a simulation system of the embodiment 1 of the electronic system in accordance with the present invention. In FIG. 8, the reference numeral 21 designates a virtual pseudo-random test pattern generator for generating serial data constituting the pseudo-random test pattern; 22 designates a virtual scan-path circuit that consists of a serial shift register with the same stages as the scan-path circuit 13 of FIG. 1, and shifts the pseudo-random test pattern every time the pseudo-random test pattern is placed in the serial shift register and supplied to the tested circuit 14 in parallel; 25 designates a logic circuit that consists of the same number of exclusive-OR circuits XOR0–XOR3 as the stages of the signature register of FIG. 1, and carries out the exclusive OR operations between data constituting the operation result the tested circuit 14 outputs in response to the pseudo-random test pattern supplied in parallel from the virtual scan-path circuit 22; and 26 designates a virtual signature register for compressing the operation result of the tested circuit 14 by loading the logical result of the logic circuit 25 in parallel.

Next, the operation of the simulation system will be described.

The simulation system carries out the evaluation of the operation of the tested circuit 14 through the following roughly divided four processings.

(1) Set initial patterns to the virtual pseudo-random test pattern generator 21 and virtual signature register 26.

To prevent the simulation system from performing undefined operation, initial values are set to the virtual pseudo-random test pattern generator 21 and to the flip-flops SS0–SS3 of the virtual signature register 26. For example, the flip-flops are set at {SS0, SS1, SS2, SS3}={0, 0, 0, 0}.

(2) Shift the contents of the virtual pseudo-random test pattern generator 21 and virtual scan-path circuit 22 $n$ times, where n is the number of the stages of the virtual scan-path circuit 22 (thus, in the example as shown in FIG. 8, they are shifted 9 times).

When the signals HOLDG and LOADG are set at "0", the virtual pseudo-random test pattern generator 21 serially supplies the virtual scan-path circuit 22 with the 9-bit data constituting the pseudo-random test pattern, and the virtual scan-path circuit 22 shifts the data 9 times. Thus, the pseudo-random test pattern is placed in the serial register of the virtual scan-path circuit 22.

(3) Supply from the virtual scan-path circuit 22 to the tested circuit 14 the pseudo-random test pattern in parallel, and obtain by the logic circuit 25 XORs between data constituting the operation result of the tested circuit 14.

When the pseudo-random test pattern is set in the serial shift register of the virtual scan-path circuit 22, the virtual scan-path circuit 22 supplies the tested circuit 14 with the pseudo-random test pattern in parallel. Then the tested circuit 14 executes the logical operation in accordance with the pseudo-random test pattern, and the logic circuit 25 carries out the XOR operations between the data constituting the operation result of the tested circuit 14.

In FIG. 8, the XOR3 of the logic circuit 25 receives the data $I0(t)$, $I4(t)$ and $I8(t)$ and obtains their XOR; the XOR2 receives the data $I3(t)$ and $I7(t)$ and obtains their XOR; the XOR1 receives the data $I2(t)$ and $I6(t)$ and obtains their XOR; and the XOR1 receives the data $I1(t)$ and $I5(t)$ and obtains their XOR. Here, the data fed to the XOR0–XOR3 correspond to the sets of data enclosed by the thick lines, broken lines and thin lines, and the set of unenclosed data of FIG. 7.

Receiving the logical results output from the XOR0–XOR3 of the logic circuit 25, the virtual signature register 26 supplies them to the XORK0–XORK3, and stores the operation results of the XORK0–XORK3 into the flip-flops SS0–SS3 constituting the shift register in synchronism with the clock signal. At the same time, the virtual pseudo-random test pattern generator 21 and virtual scan-path circuit 22 shifts their contents by one step in synchronism with the clock signal so that the next pseudo-random test pattern is set in the serial shift register of the virtual scan-path circuit 22.

(4) Iterate the processing (3) (m−1) times.

When the next pseudo-random test pattern is set in the serial shift register of the virtual scan-path circuit 22, the virtual scan-path circuit 22 iterates supplying the pseudo-random test pattern in parallel to the tested circuit 14 (m−1) times, so that compression processing of the data representing the operation results of the tested circuit 14 is also carried out (m−1) times.

Thus, the shift register SS0–SS3 of the virtual signature register 26 is loaded with the values similar to those of the flip-flops S0–S3 of the signature register 15.

The number of clock cycles required to carry out the steps of the processings (3) and (4) is m because once the initial pseudo-random test pattern has been set, the next pseudo-random test pattern can be placed in the virtual scan-path circuit 22 sequentially by a single step shift operation.

As described above, the simulation system of the present embodiment 1 comprises the virtual scan-path circuit 22 for shifting, every time it supplies the tested circuit 14 with the pseudo-random test pattern in parallel, the pseudo-random test pattern by one bit; the logic circuit 25 for executing, when the tested circuit 14 outputs the operation result, the logical operations between the data constituting the operation result; and the virtual signature register 26 for compressing the operation result of the tested circuit 14 by loading the operation result of the logic circuit 25 in parallel. This offers an advantage of being able to evaluate the logical operations of the tested circuit 14 mounted on the electronic system in a short time.

EMBODIMENT 2

Although the number of the output terminals of the tested circuit 14 is identical to the number of the stages of the scan flip-flops SFF0–SFF8 constituting the scan-path circuit 13 in the foregoing embodiment 1, this is not essential. For example, when the number of the output terminals of the tested circuit 14 is less than the number of the stages of the flip-flops constituting the scan-path circuit 13 as shown in FIG. 9, the scan-path circuit 13 can be configured as follows.

More specifically, flip-flops RFF6–RFF8 in the scan-path circuit 13, which are not connected to the output terminals of the tested circuit 14, can be configured such that they load "0" (fixed value) when the scan-path circuit 13 loads the operation result of the tested circuit 14 in parallel (when the signal SM=0, AND circuits constituting the flip-flops RFF6–RFF8 always output "0").

Figure 9:
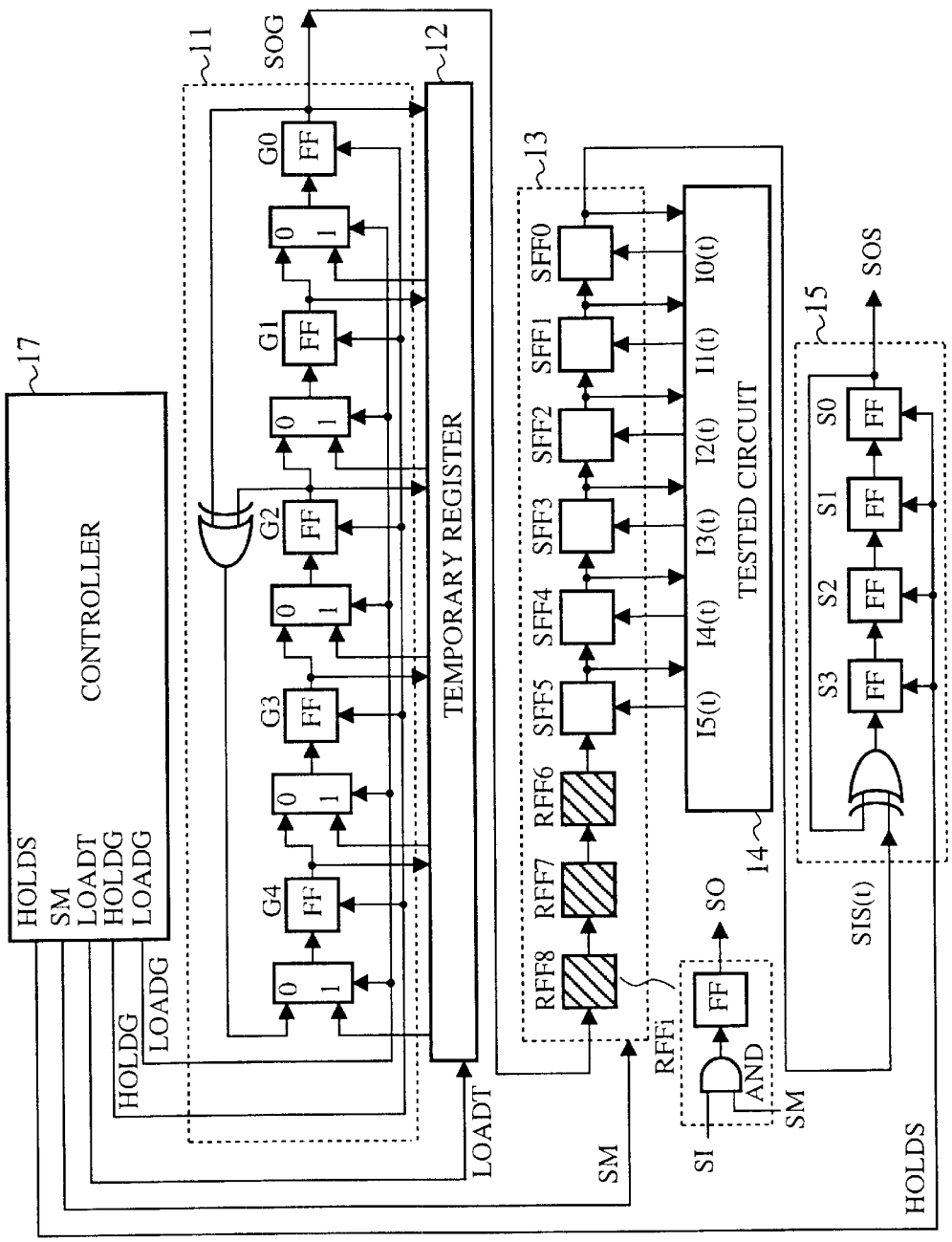
FIG. 9 is a block diagram showing an embodiment 2 of the electronic system with a self-test function in accordance with the present invention.
Figure 10:
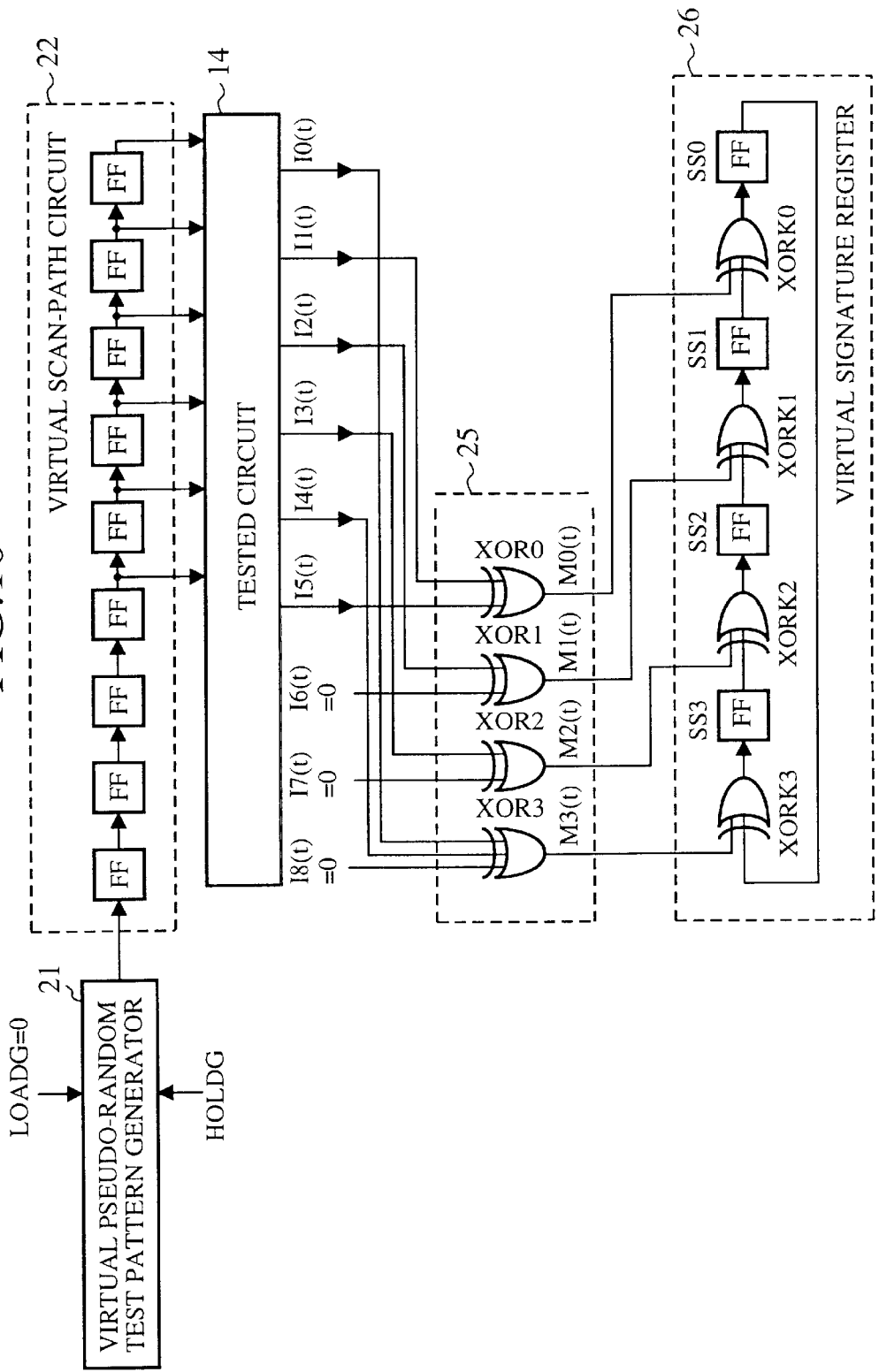
FIG. 10 is a block diagram showing a simulation system of the embodiment 2 of the electronic system in accordance with the present invention.

Thus, the simulation system corresponding to the electronic system as shown in FIG. 9 can be configured as shown in FIG. 10. Since the simulation system of FIG. 10 operates as that of FIG. 8, the description thereof is omitted here.

EMBODIMENT 3

Figure 11:
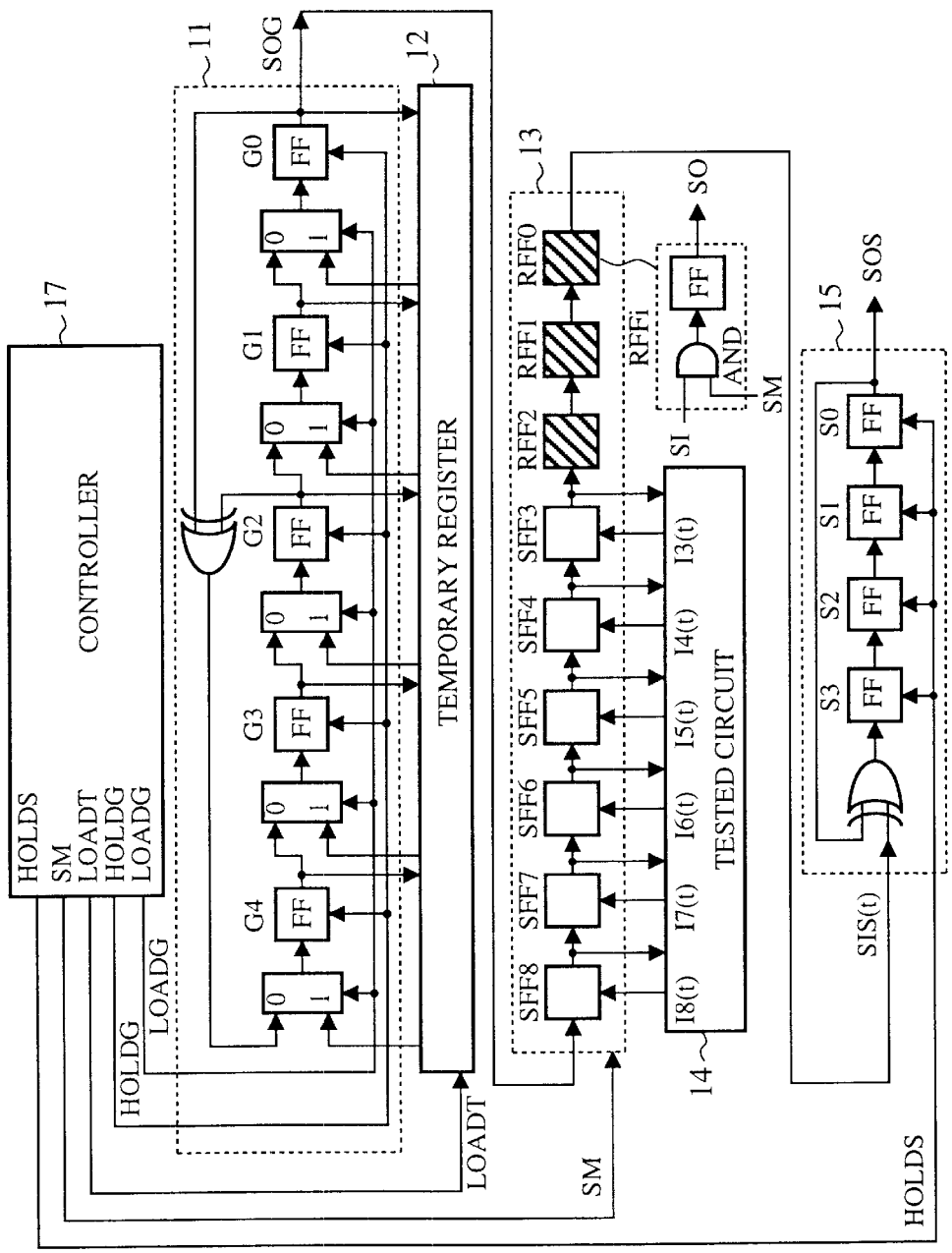
FIG. 11 is a block diagram showing an embodiment 3 of the electronic system with a self-test function in accordance with the present invention.

Although the flip-flops RFF6–RFF8 which are not connected to the output terminals of the tested circuit 14 are provided in initial stages of the scan-path circuit 13 in the foregoing embodiment 2, flip-flops RFF0–RFF2 which are not connected to the output terminals of the tested circuit 14 can be provided in final stages of the scan-path circuit 13 as shown in FIG. 11.

The flip-flops RFF0–RFF2 in the scan-path circuit 13, which are not connected to the output terminals of the tested circuit 14, can be configured just as the flip-flops RFF6–Rff8 in the foregoing embodiment 2. That is, they load "0" (fixed value) when the scan-path circuit 13 loads the operation result of the tested circuit 14 in parallel (when the signal SM=0, AND circuits constituting the flip-flops RFF0–RFF2 always output "0").

Figure 12:
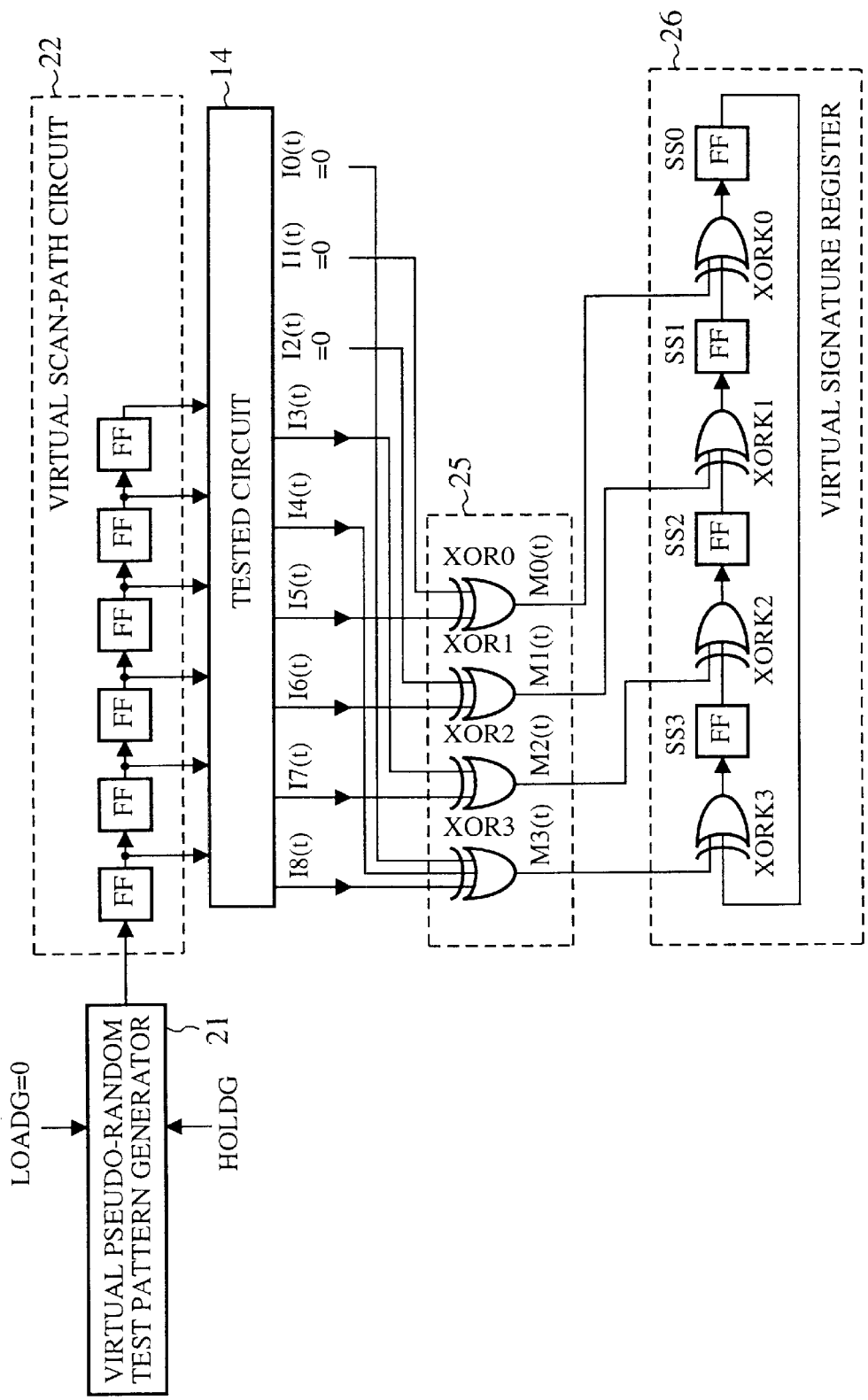
FIG. 12 is a block diagram showing a simulation system of the embodiment 3 of the electronic system in accordance with the present invention.

Thus, the simulation system corresponding to the electronic system as shown in FIG. 11 can be configured as shown in FIG. 12. Since the simulation system of FIG. 12 operates as that of FIG. 8, the description thereof is omitted here.

EMBODIMENT 4

Although when the number of the output terminals of the tested circuit 14 is less than the number of the stages of the flip-flops constituting the scan-path circuit 13, the flip-flops which are not connected to the output terminals of the tested circuit 14 load "0" (fixed value) in the foregoing embodiments 2 and 3, this is not essential. For example, as shown in FIG. 13, the flip-flops not connected to the output terminals of the tested circuit 14 can be removed, with adding an AND gate 32 between the scan-path circuit 13 and signature register 15, to be controlled.

In this case, the data output from the AND gate 32 is controlled by controlling the level of a signal SISFIX by a controller 31. Specifically, the data I6(t), I7(t) and I8(t) are controlled such that they all becomes zero, which makes this electronic system equivalent to that of the foregoing embodiment 2 (except that although the number of the stages of the scan-path circuit 13 is six, t he scan-path circuit 13 is operated as though the number of the stages were nine).

Figure 13:
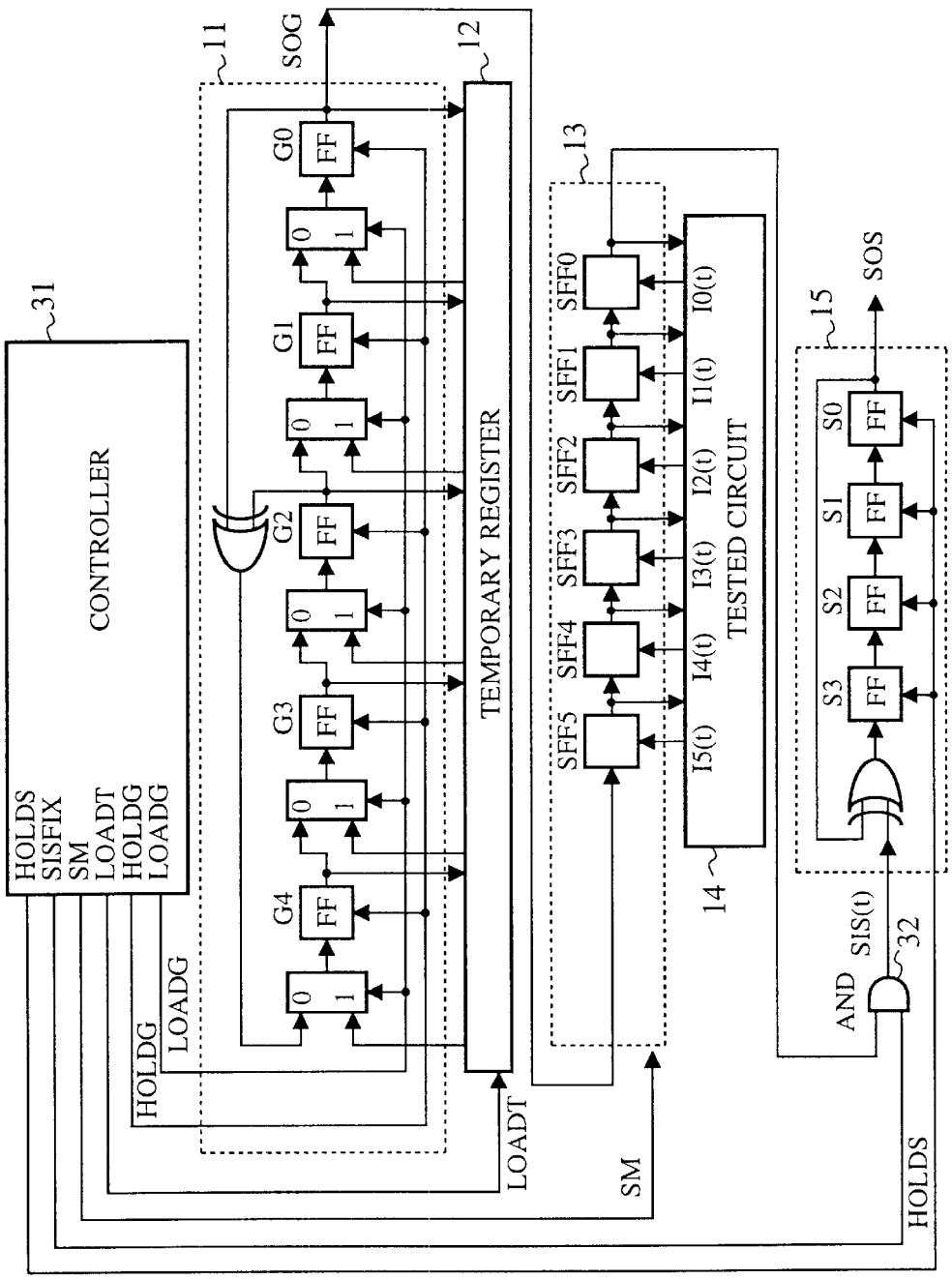
FIG. 13 is a block diagram showing an embodiment 4 of the electronic system with a self-test function in accordance with the present invention.
Figure 14:
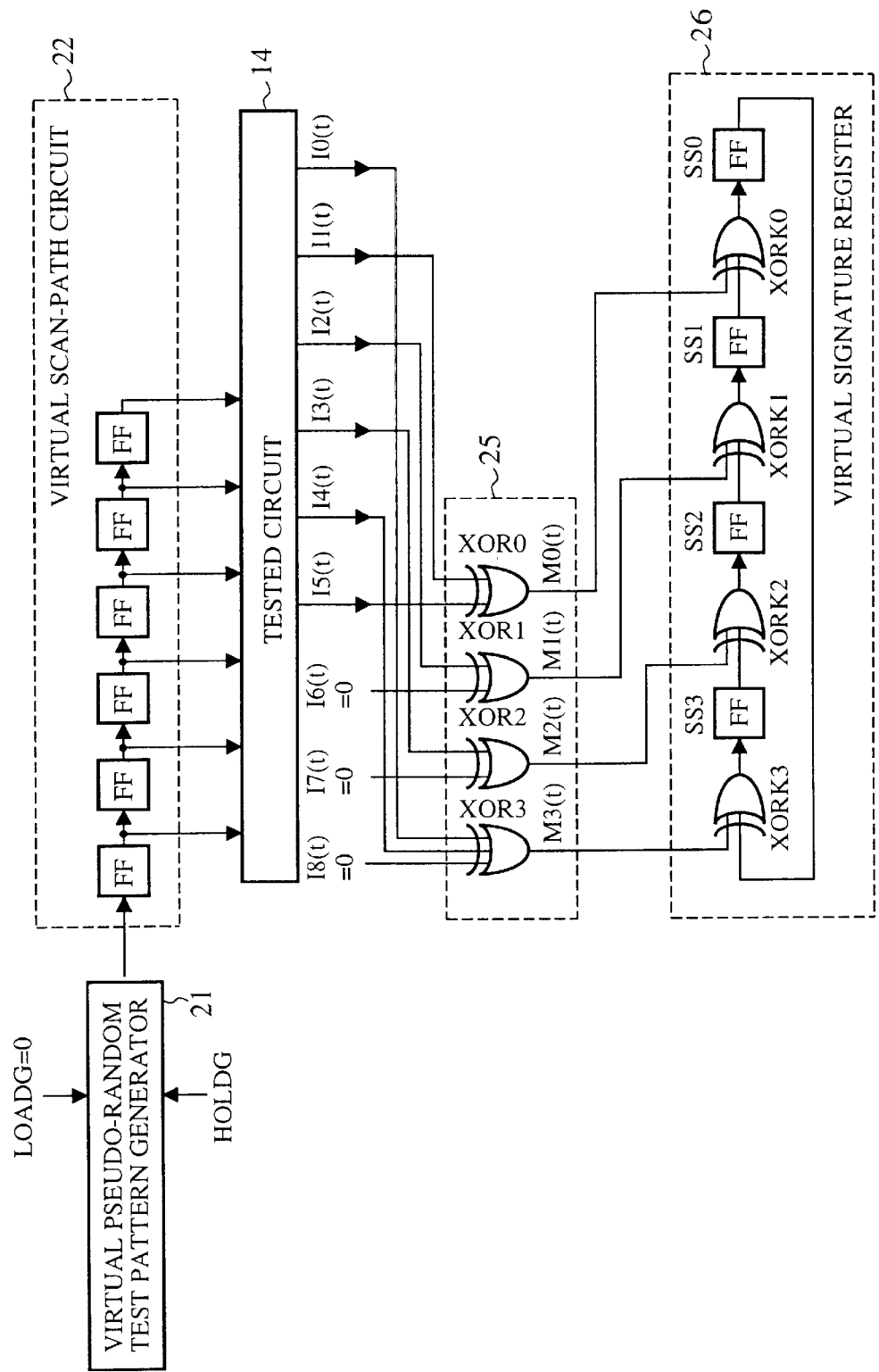
FIG. 14 is a block diagram showing a simulation system of the embodiment 4 of the electronic system in accordance with the present invention.

Thus, the simulation system corresponding to the electronic system as shown in FIG. 13 can be configured as shown in FIG. 14. Since the simulation system of FIG. 14 operates as that of FIG. 8, the description thereof is omitted here.

EMBODIMENT 5

Figure 15:
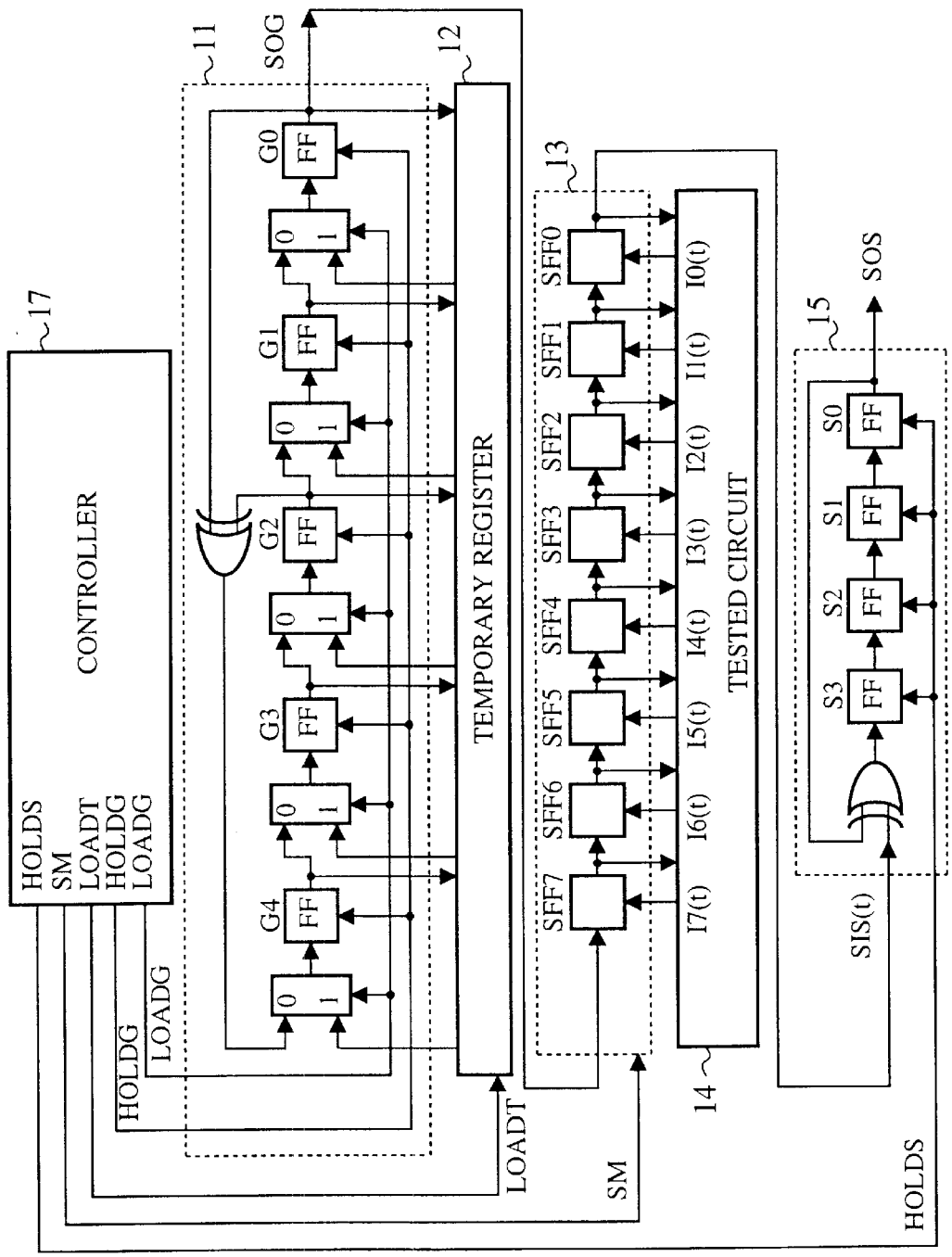
FIG. 15 is a block diagram showing an embodiment 5 of the electronic system with a self-test function in accordance with the present invention.

Although the number of stages of the scan-path circuit 13 equals one plus the integer multiple of the number of stages of the signature register 15 (for example, the number of stages of the scan-path circuit 13 is nine, and that of the signature register 15 is four) in the foregoing embodiment 1, this is not essential. For example, as shown in FIG. 15, the number of stages of the scan-path circuit 13 can be an integer multiple 15 of that of the data compression circuit (in the example of FIG. 15, the number of stages of the scan-path circuit 13 is eight, and that of the signature register 15 is four). This can offer an advantage similar to that of the foregoing embodiment 1.

In this case, the operation result of the tested circuit 14, which is represented by 8-bit data, is compressed to 4-bit data. For example, the flip-flop S3 of the signature register 15 stores the results of the XORs between the data (I0(0), I4(0), I0(1), I4(1), . . . ) which are enclosed by the thick lines in FIG. 16; the flip-flop S2 stores the results of the XORs between the data (I1(0), I5(0), I1(1), I5(1), . . . ) which are enclosed by the broken lines in FIG. 16; the flip-flop S1 stores the results of the XORs between the data (I2(0), I6(0), I2(1), I6(1), . . . ) which are enclosed by the thin lines in FIG. 16; and the flip-flop S0 stores the result of the XORs between the unenclosed data (I3(0), I7(0), I3(1), I7(1), . . . ) in FIG. 16.

The relationships between the flip-flops S0–S3 and the set of four data (logical result) vary depending on the number of times m of the iteration.

Figure 17:
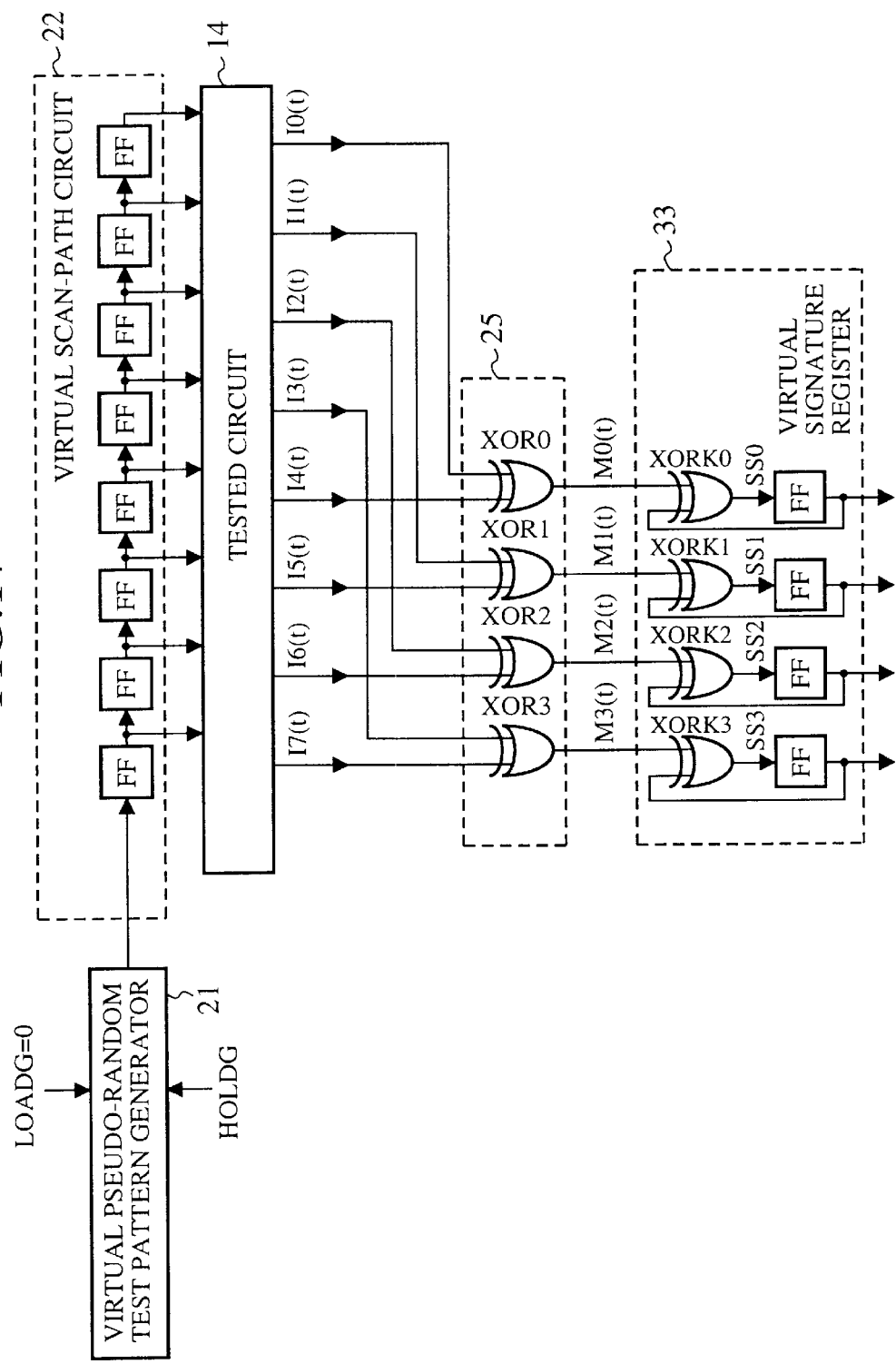
FIG. 17 is a block diagram showing a simulation system of the embodiment 5 of the electronic system in accordance with the present invention.

A simulation system corresponding to the electronic system of FIG. 15 can be arranged as shown in FIG. 17. In this case, XORK0–XORK3 of a virtual signature register 33 must be connected such that they receive the output data of the XOR0–XOR3 of the logic circuit 25 and the output data of the post-stage registers SS0–SS3, respectively, and supply their operation results to the registers SS0–SS3.

EMBODIMENT 6

Figure 18:
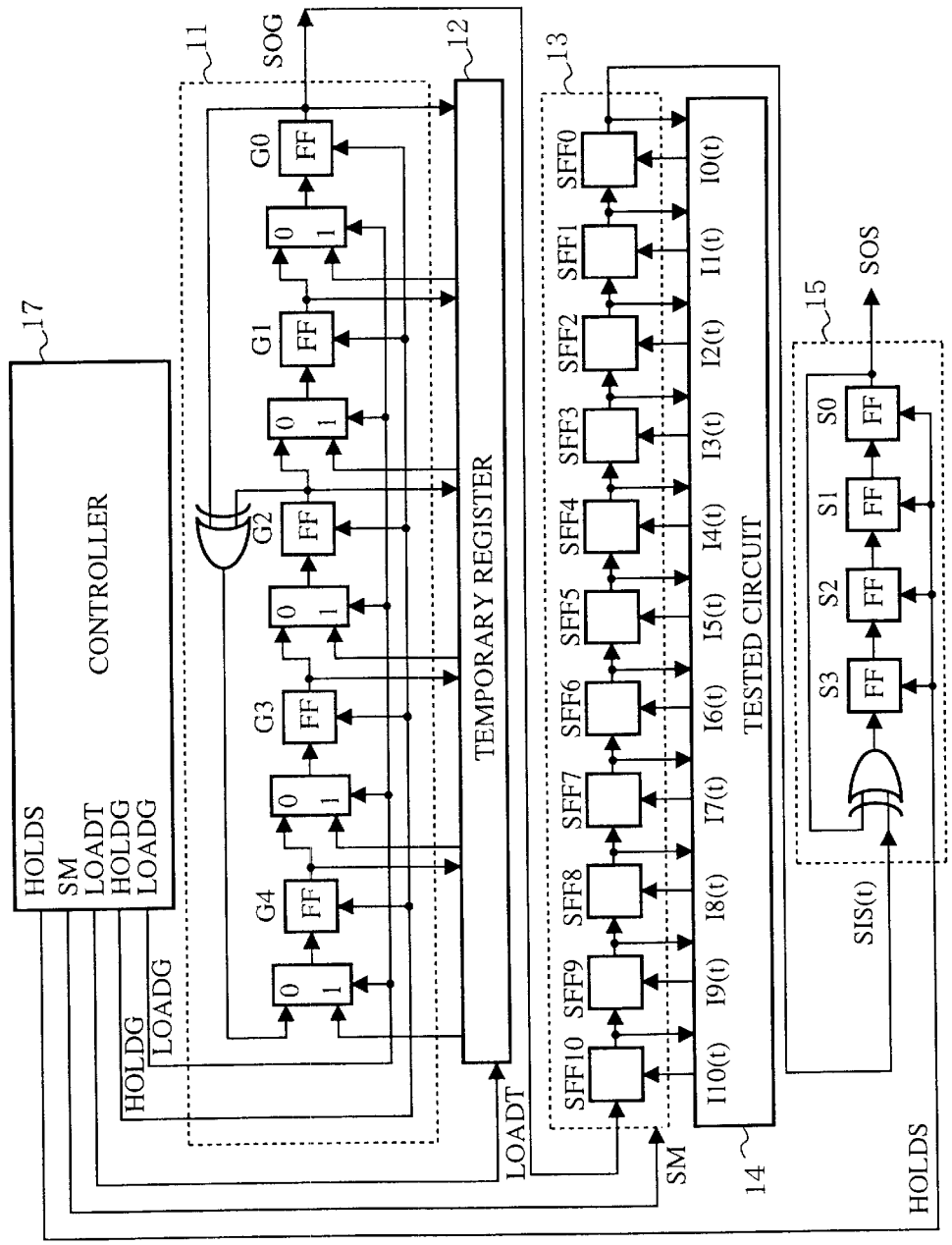
FIG. 18 is a block diagram showing an embodiment 6 of the electronic system with a self-test function in accordance with the present invention.

Although the number of stages of the scan-path circuit 13 equals one plus the integer multiple of the number of stages of the signature register 15 (for example, the number of stages of the scan-path circuit 13 is nine, and that of the signature register 15 is four) in the foregoing embodiment 1, this is not essential. For example, as shown in FIG. 18, the number of stages of the scan-path circuit can be an integer multiple of that of the data compression circuit minus one (in the example of FIG. 18, the number of stages of the scan-path circuit 13 is 11, and that of the signature register 15 is four). This can offer an advantage similar to that of the foregoing embodiment 1.

Figure 19:
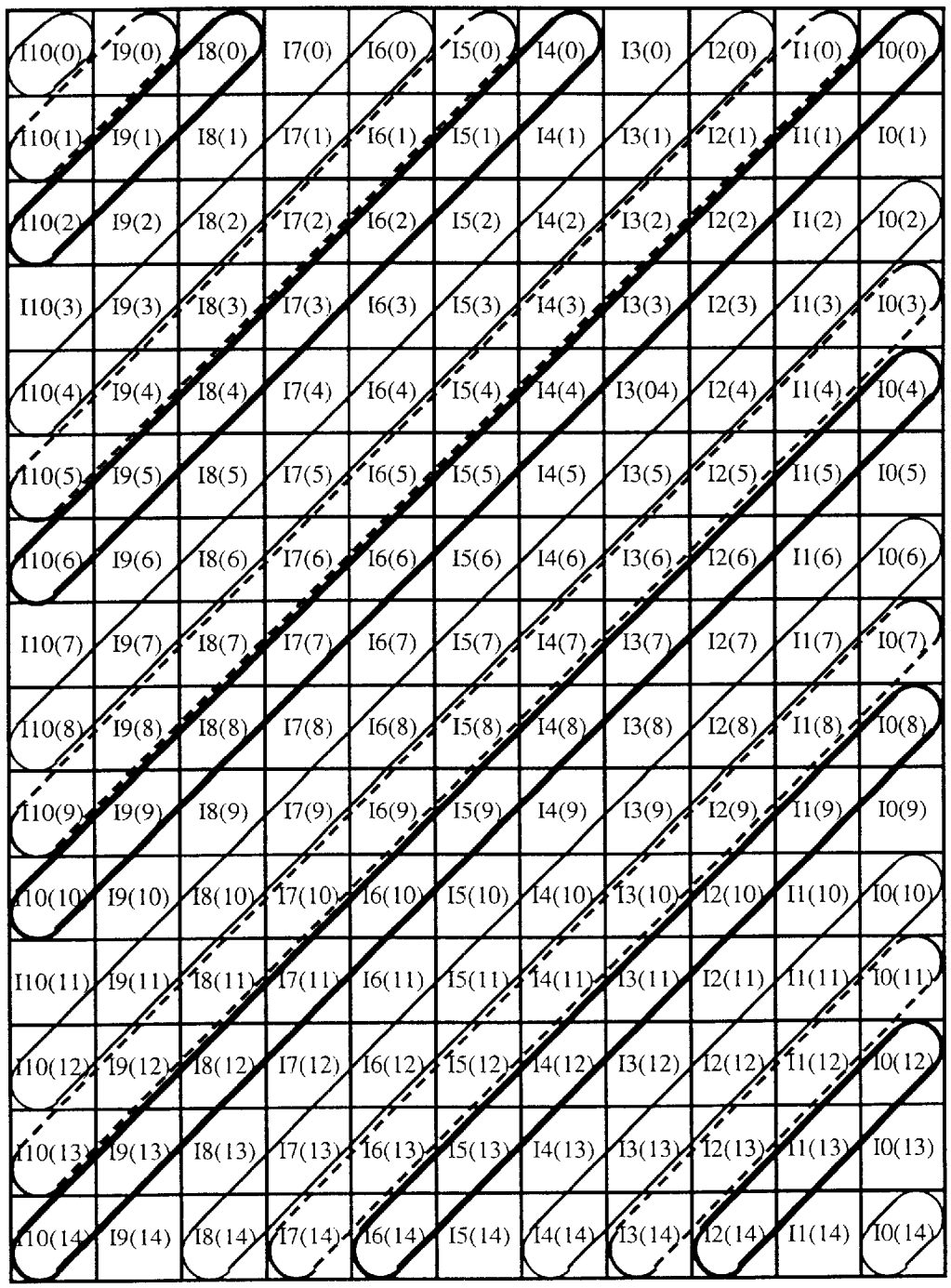
FIG. 19 is a diagram illustrating relationships between individual data.

In this case, the operation result of the tested circuit 14, which is represented by 11-bit data, is compressed to 4-bit data. For example, the flip-flop S3 of the signature register 15 stores the results of the XORs between the data (I0(0), I4(0), I0(1), I4(1), . . . ) which are enclosed by the thick lines in FIG. 19; the flip-flop S2 stores the results of the XORs between the data (I1(0), I5(0), I9(0), I2(1), . . . ) which are enclosed by the broken lines in FIG. 19; the flip-flop S1 stores the results of the XORs between the data (I2(0), I6(0), I10(0), I3(1), . . . ) which are enclosed by the thin lines in FIG. 19; and the flip-flop S0 stores the results of the XORs between the unenclosed data (I3(0), I7(0), I0(1), I4(1), . . . ) in FIG. 19.

The relationships between the flip-flops S0–S3 and the set of four data (logical result) vary depending on the number of times m of the iteration.

Figure 20:
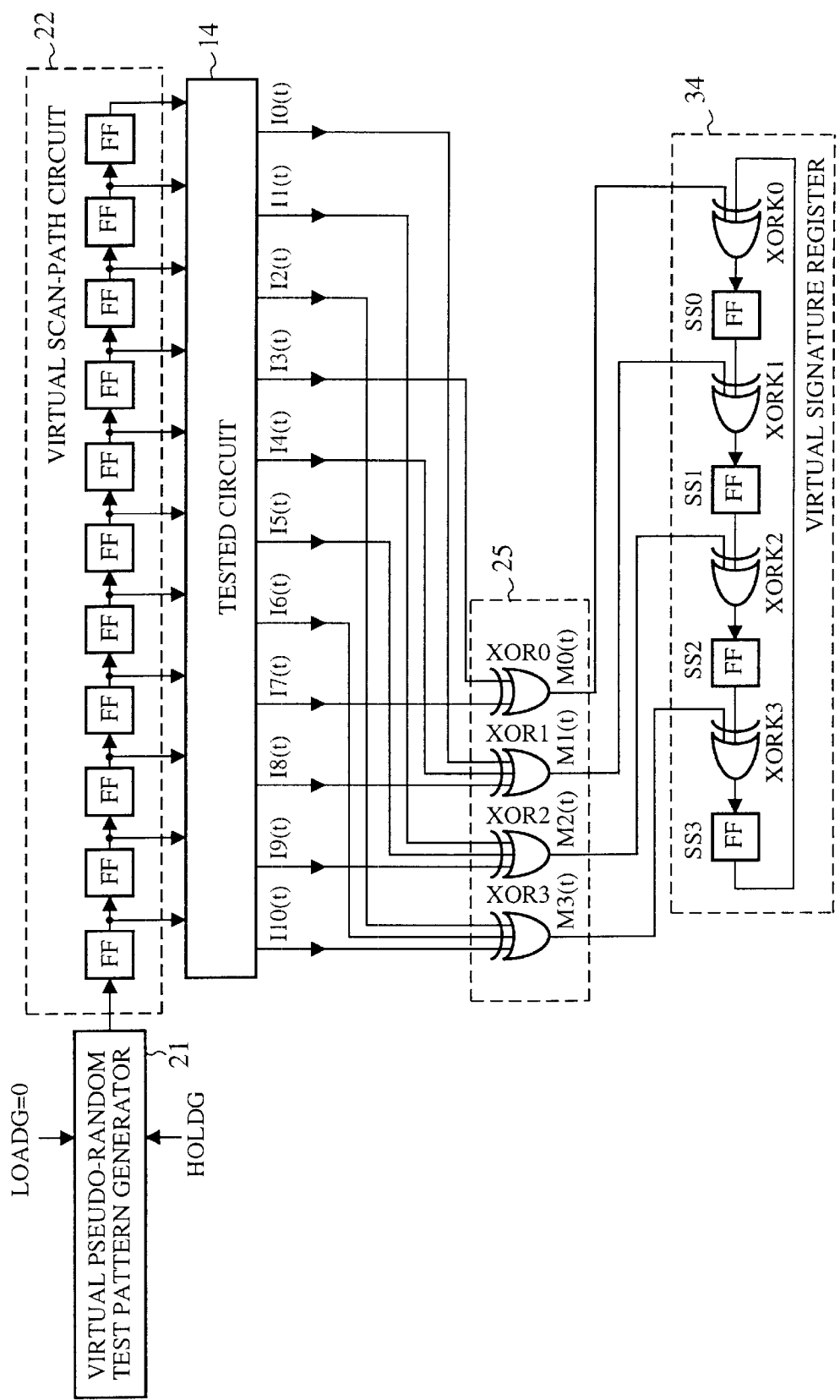
FIG. 20 is a block diagram showing a simulation system of the embodiment 6 of the electronic system in accordance with the present invention.

A simulation system corresponding to the electronic system of FIG. 18 can be arranged as shown in FIG. 20. In this case, the connection of XORK0–XORK3 of a virtual signature register 34 must be opposite to that of the XORK0–XORK3 of the virtual signature register 26 in FIG. 8. In other words, the XORK0 must be placed at the initial position of the virtual signature register 34, and the XORK3 at the final position.

EMBODIMENT 7

Figure 21:
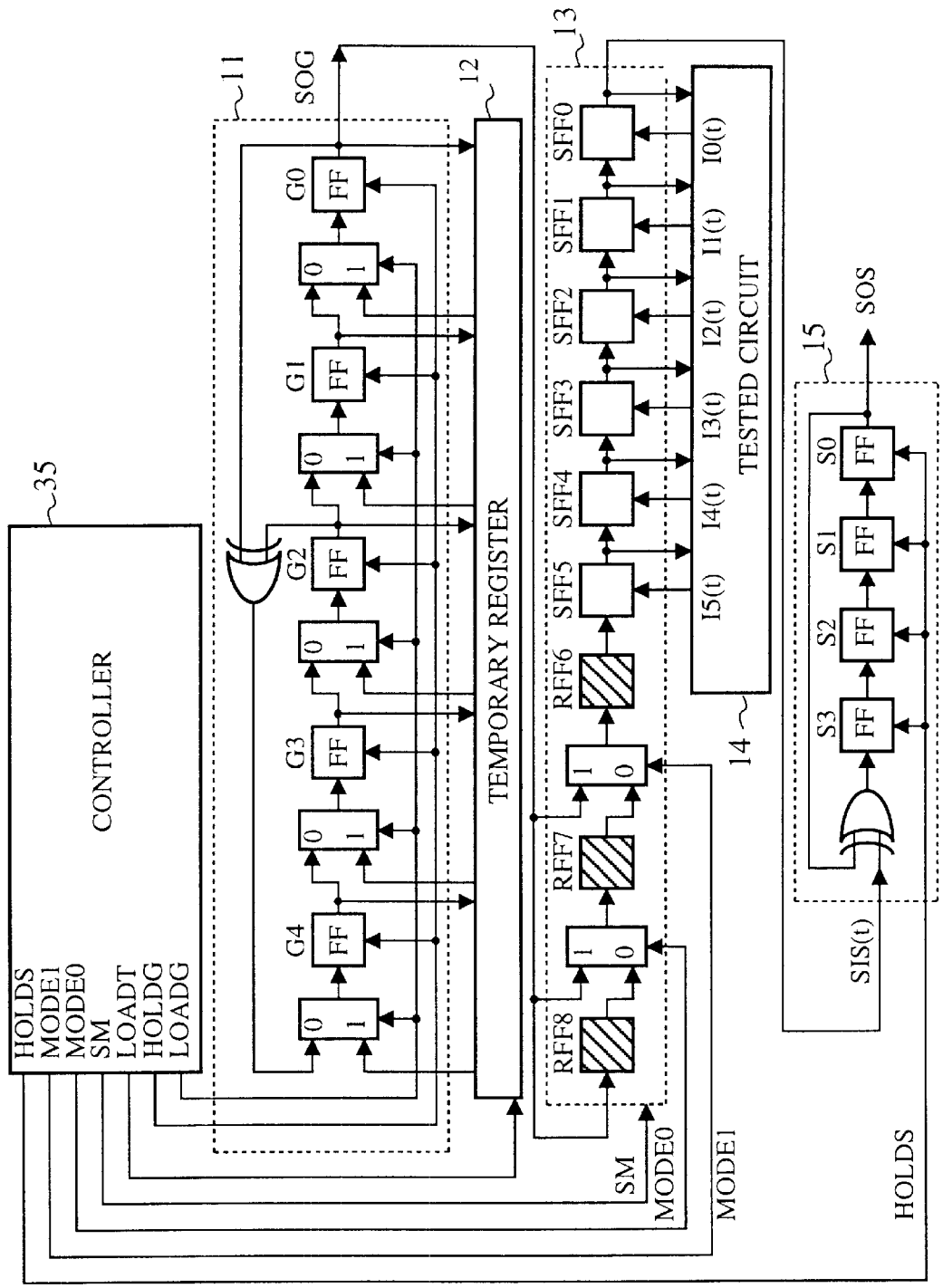
FIG. 21 is a block diagram showing an embodiment 7 of the electronic system with a self-test function in accordance with the present invention.

Although in the foregoing embodiments 1, 5 and 6, the number of stages of the scan-path circuit 13 equals one plus the integer multiple of the number of stages of the signature register 15, the integer multiple, and the integer multiple minus one, respectively, the number of stages of the scan-path circuit 13 can be made variable as shown in FIG. 21.

To set the number of stages of the scan-path circuit 13 at one plus the integer multiple of the number of stages of the signature register 15, the controller sets signals MODE0 and MODE1 to "0" so that the flip-flop RFF8 shifts its data to the flip-flop RFF7, and the flip-flop RFF7 shifts its data to the flip-flop RFF6. This makes the configuration of the scan-path circuit 13 of FIG. 21 equivalent to that of the scan-path circuit 13 of FIG. 9.

To set the number of stages of the scan-path circuit 13 at the integer multiple of that of the signature register 15, the controller sets signals MODE0 and MODE1 to "1" and "0", respectively, so that the flip-flop G0 of the pseudo-random test pattern generator 11 shifts its data to the flip-flop RFF7, and the flip-flop RFF7 shifts its data to the flip-flop RFF6. This makes the configuration of the scan-path circuit 13 of FIG. 21 equivalent to that of the scan-path circuit 13 of FIG. 15.

To set the number of stages of the scan-path circuit 13 at the integer multiple of the number of stages of the signature register 15 minus one, the controller sets signals MODE0 and MODE1 to "1", so that the flip-flop G0 of the pseudo-random test pattern generator 11 shifts its data to the flip-flop RFF6.

Thus switching the three operation modes makes it possible to change the results of XORs stored in the flip-flops S0–S3 of the signature register 15, that is, the combination of the data to be subjected to the XOR operations. This offers an advantage of being able to improve a fault detection ratio because a failure not detected by a first mode test can be detected by a second mode test (it sometimes occurs that a failure with an odd number of faults can be detected, but a failure with an even number of faults cannot be detected, or vice versa, because the XORs are executed between the data)

EMBODIMENT 8

Figure 22:
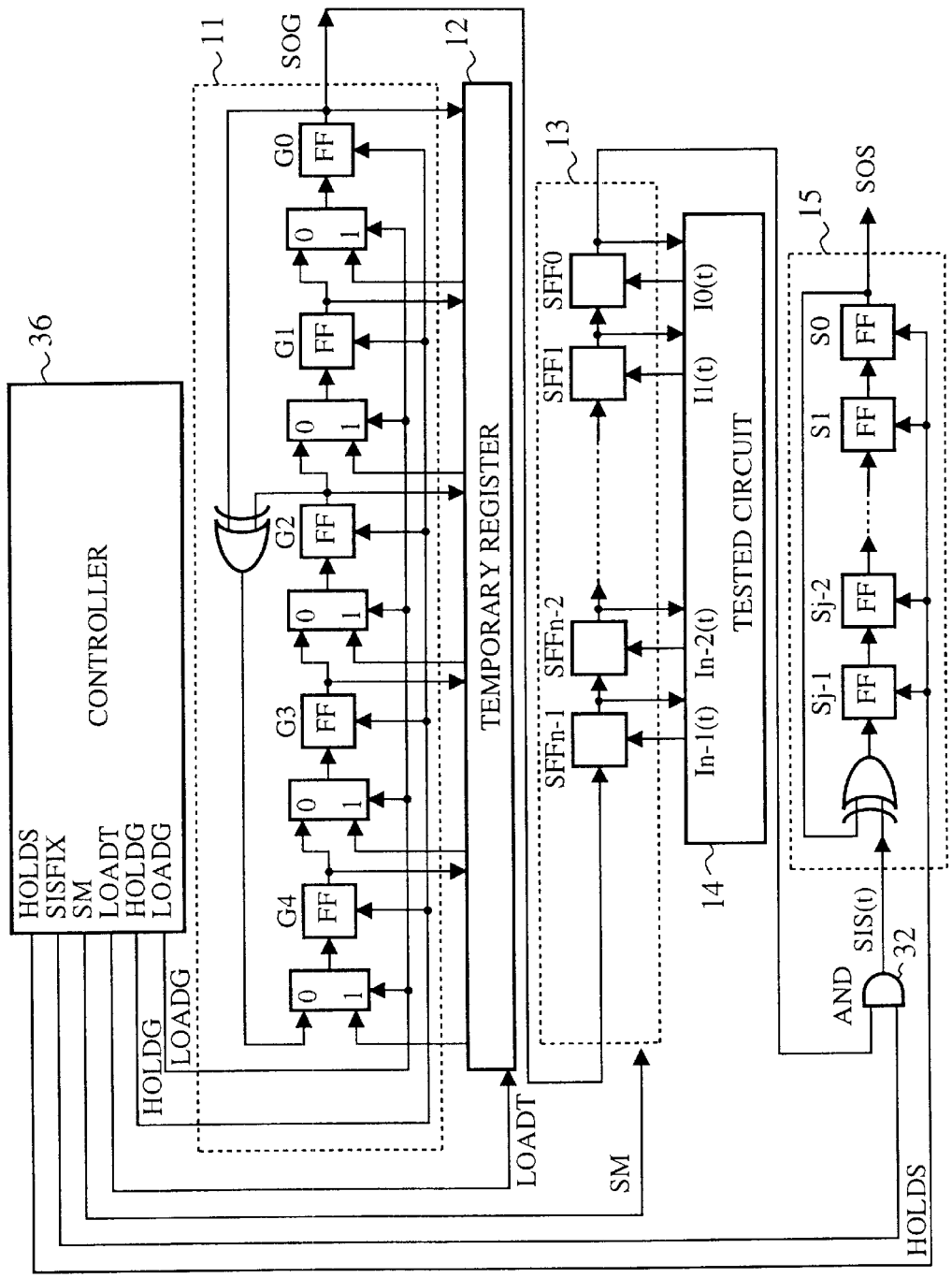
FIG. 22 is a block diagram showing an embodiment 8 of the electronic system with a self-test function in accordance with the present invention.

Although three operation modes are switched by the controller 35 that changes the levels of the signals MODE0 and MODE 1 in the foregoing embodiment 7, this is not essential. For example, as shown in FIG. 22, a controller 36 can switch the three operation modes by controlling the level of the signal SISFIX to change the output signal of the AND gate 32, offering the same advantage as that of the foregoing embodiment 7.

For example, to operate the virtual scan-path circuit 22 as a circuit with nine stages, when the number of stages n of the scan-path circuit 13 is six, and the number of stages j of the signature register 15 is four (that is, to set the number of stages of the virtual scan-path circuit 22 equal to one plus the integer multiple of the number of stages of the signature register 15), the controller 36 controls the level of the signal SISFIX so that that data I6(t), I7(t) and I8(t) all becomes zero (see, embodiment 4).

EMBODIMENT 9

Although the simulation system includes the signature register 15 in the foregoing embodiments 1-8, the signature register 15 and logic circuit 25 can be removed from the simulation system if the tested circuit 14 carries out by software logical operations between the operation results Ix(t) (x=0, 1, 2, 3, . . . ) to be output in parallel from the tested circuit 14, thereby obtaining the expected values (for example, SS0, SS1, SS2 and SS3).

What is claimed is:

1. An electronic system with a self-test function comprising:

a pseudo-random test pattern generator for serially outputting data constituting a pseudo-random test pattern;

a scan-path circuit for capturing the pseudo-random test pattern by receiving the data serially output from the pseudo-random test pattern generator, for supplying the pseudo-random test pattern in parallel to a tested circuit, for receiving in parallel an operation result of the tested circuit, and for serially outputting data constituting the operation result;

a data compression circuit for compressing the operation result by receiving the data serially output from said scan-path circuit; and a memory for storing, when said pseudo-random test pattern generator begins to serially output the data constituting the pseudo-random test pattern, a seed of a 1-bit shifted pseudo-random test pattern that is obtained by shifting the pseudo-random test pattern that is obtained by shifting the pseudo-random test pattern by one bit, wherein said pseudo-random test pattern generator serially supplies said scan-path circuit with data constituting the 1-bit shifted pseudo-random test pattern when said scan-path circuit loads the operation result of the tested circuit in parallel.

2. The electronic system with a self-test function according to claim 1, further comprising a comparator for comparing the operation result compressed by said data compression circuit with expected values.

3. The electronic system with a self-test function according to claim 1, wherein said data compression circuit comprises an exclusive OR circuit and a serial shift register, and wherein said exclusive OR circuit receives data output from a final stage of said serial shift register and data serially output from said scan-path circuit, and supplies an initial stage of said serial shift register with data output from said exclusive OR circuit.

4. The electronic system with a self-test function according to claim 3, wherein said scan-path circuit comprises a greater number of flip-flops than a number of output terminals of said tested circuit, from which the operation result is output in parallel, and wherein each of said flip-flops not connected to the output terminals of the tested circuit loads a fixed value when said scan-path circuit loads the operation result of the tested circuit in parallel.

5. The electronic system with a self-test function according to claim 3, further comprising, between said scan-path circuit and said data compression circuit, a gate circuit for placing the serial output of said scan-path circuit at a fixed value when said scan-path circuit comprises a greater number of flip-flops than a number of output terminals of said tested circuit, from which the operation result is output in parallel.

* * * * *